United States Patent
Wang et al.

(10) Patent No.: US 12,363,980 B2
(45) Date of Patent: Jul. 15, 2025

(54) SPACER STRUCTURE FOR SEMICONDUCTOR DEVICE

(71) Applicant: Taiwan Semiconductor Manufacturing Co., Ltd., Hsinchu (TW)

(72) Inventors: Chen-Han Wang, Zhubei (TW); Ding-Kang Shih, New Taipei (TW); Chun-Hsiung Lin, Zhubei (TW); Teng-Chun Tsai, Hsinchu (TW); Zhi-Chang Lin, Zhubei (TW); Akira Mineji, Hsinchu (TW); Yao-Sheng Huang, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 168 days.

(21) Appl. No.: 17/683,251

(22) Filed: Feb. 28, 2022

(65) Prior Publication Data
US 2022/0190137 A1  Jun. 16, 2022

Related U.S. Application Data

(62) Division of application No. 16/662,333, filed on Oct. 24, 2019, now Pat. No. 11,264,485.

(51) Int. Cl.
| | |
|---|---|
| H10D 64/01 | (2025.01) |
| H10D 30/01 | (2025.01) |
| H10D 30/62 | (2025.01) |
| H10D 62/10 | (2025.01) |

(52) U.S. Cl.
CPC ......... *H10D 64/021* (2025.01); *H10D 30/024* (2025.01); *H10D 30/62* (2025.01); *H10D 62/118* (2025.01); *H10D 64/018* (2025.01)

(58) Field of Classification Search
CPC .......... H01L 29/6656; H01L 29/66553; H01L 29/6653; H01L 21/823481; H01L 29/0665; H01L 29/42392; H01L 29/78696; H01L 29/66439; H10D 64/021; H10D 30/024; H10D 30/62; H10D 62/118; H10D 64/018; H10D 30/6757; H10D 64/017; H10D 30/014; H10D 64/015; H10D 30/6735; H10D 62/121; H10D 84/0158; H10D 84/038; H10D 84/0151

See application file for complete search history.

(56) References Cited

U.S. PATENT DOCUMENTS

| | | |
|---|---|---|
| 9,954,058 B1 | 4/2018 | Mochizuki et al. |
| 2017/0110554 A1* | 4/2017 | Tak ................. H01L 29/42392 |
| 2017/0229463 A1* | 8/2017 | Bergendahl ......... H01L 29/0847 |
| 2017/0250261 A1 | 8/2017 | Kim et al. |

(Continued)

*Primary Examiner* — Khaja Ahmad
*Assistant Examiner* — Sun Mi Kim King
(74) *Attorney, Agent, or Firm* — Sterne, Kessler, Goldstein & Fox P.L.L.C.

(57) ABSTRACT

The present disclosure describes an inner spacer structure for a semiconductor device and a method for forming the same. The method for forming the inner spacer structure in the semiconductor device can include forming a vertical structure over a substrate, forming a gate structure over a portion of the vertical structure, exposing sidewalls of the portion of the vertical structure, forming multiple spacers over the sidewalls of the portion of the vertical structure, and forming a void in each of the multiple spacers.

20 Claims, 23 Drawing Sheets

(56) References Cited

U.S. PATENT DOCUMENTS

| | | |
|---|---|---|
| 2017/0365604 A1 | 12/2017 | Shu et al. |
| 2018/0331232 A1 | 11/2018 | Frougier et al. |
| 2019/0157444 A1 | 5/2019 | Yang et al. |
| 2019/0393357 A1 | 12/2019 | Chen et al. |
| 2020/0083352 A1 | 3/2020 | Chanemougame et al. |
| 2020/0105896 A1 | 4/2020 | Ando et al. |
| 2021/0074548 A1 | 3/2021 | Lin et al. |
| 2021/0083074 A1 | 3/2021 | Yang et al. |
| 2021/0126106 A1 | 4/2021 | Wang et al. |

\* cited by examiner

SPACER STRUCTURE FOR SEMICONDUCTOR DEVICE

CROSS-REFERENCE TO RELATED APPLICATION

This patent application is a divisional of U.S. patent application Ser. No. 16/662,333, filed on Oct. 24, 2019 and titled "Spacer Structure for Semiconductor Device," which is incorporated by reference herein in its entirety.

BACKGROUND

Advances in semiconductor technology has increased the demand for semiconductor devices with higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (finFETs), and nano-sheet FETs. Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
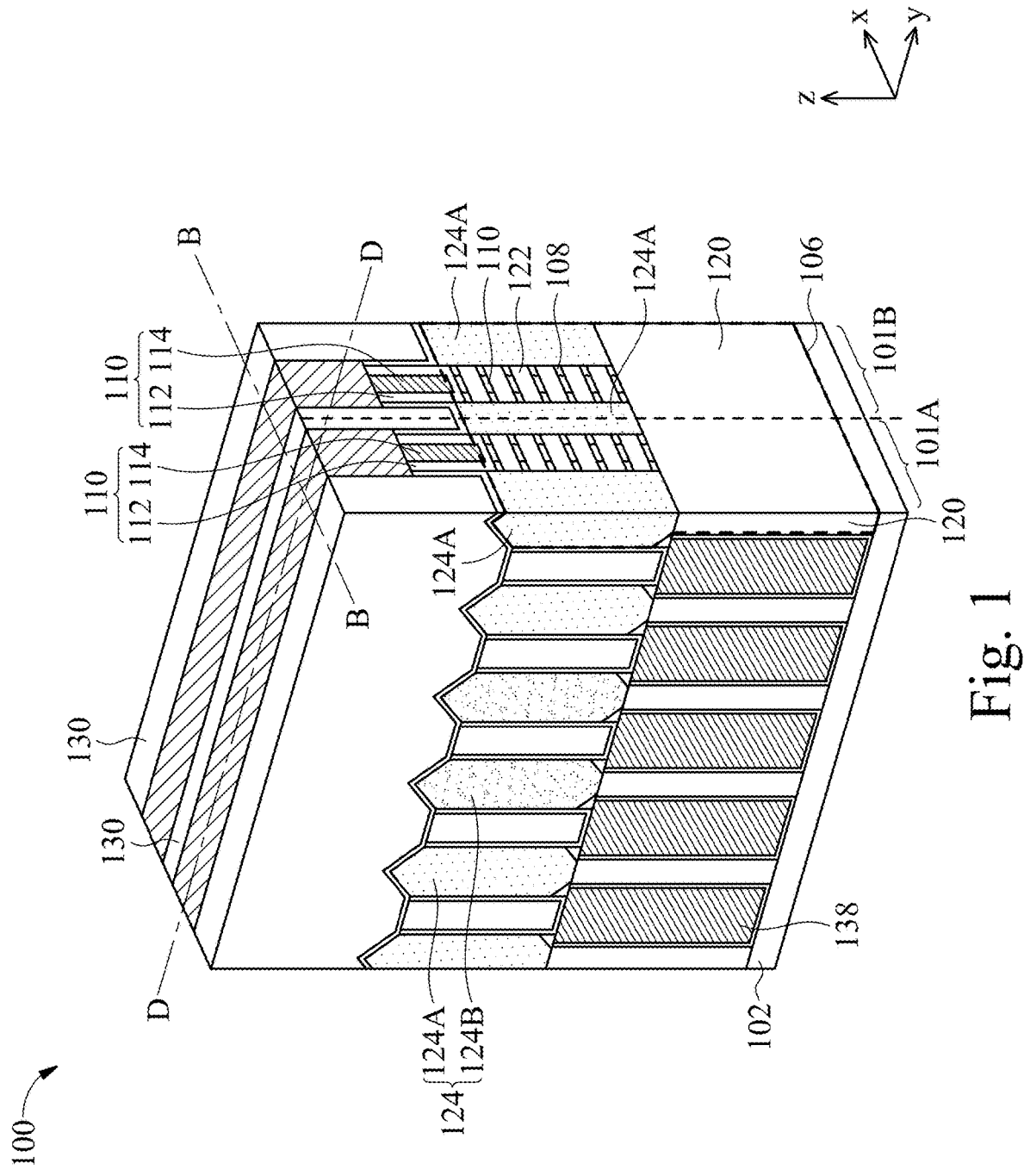
FIG. 1 is an isometric view of a semiconductor device, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "underlying," "underneath," "below," "lower," "above," "upper," "lower," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fins associated with fin field effect transistors (finFETs) or nano-sheet FETs may be patterned by any suitable method. For example, the fins may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "nominal" refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value).

As used herein, the term "vertical" means nominally perpendicular to a surface, such as a substrate's surface.

As used herein, the term "selectivity" refers to the ratio of the etch rates of two materials under the same etching conditions.

As used herein, the term "high-k" refers to a high dielectric constant. In some embodiments, high-k refers to a dielectric constant that is greater than the dielectric constant of $SiO_2$ (e.g., greater than 3.9).

As used herein, the term "low-k" refers to a small dielectric constant. In some embodiments, low-k refers to a dielectric constant that is less than the dielectric constant of $SiO_2$ (e.g., less than 3.9).

Technology advances in the semiconductor industry drive the pursuit of integrated circuits (ICs) having higher device density, higher performance, and lower cost. In the course of the IC evolution, nano-sheet FETs have been adopted to replace planar transistor and/or fin field-effect transistor (finFET) to achieve ICs with higher device densities. The nano-sheet FET can use a gate-all-around (GAA) gate structure to surround each nano-sheet channel layer to effectively reconcile short channel effects. Nano-sheet FETs require inner spacers to physically separate the nano-sheet FET's source-drain regions from the GAA structure between each nano-sheet channel. The thickness of the inner spacers can be thin (e.g., about 5 nm). However, such thin inner spacers can contribute to undesired electrical coupling (e.g., capacitive coupling) between the nano-sheet FET's gate and source/drain terminals, thus degrading device performance (e.g., speed) of the IC.

The present disclosure is directed to a fabrication method and structures that provide a low-k inner spacer for nano-sheet FETs within an IC. In some embodiments, each nano-sheet FETs can include a source-drain region, one or more nano-sheet channels connected to the source-drain region, a metal gate structure surrounding each nano-sheet channel, and multiple inner spacers formed between the metal gate structure and the source-drain region. Each inner spacer can encapsulate a void structure. In some embodiments, each inner spacer can include a dielectric layer, an oxide layer, and a void structure formed between the dielectric layer and the oxide layer. Since the dielectric constant of the void structure can be close to 1 (e.g., the void can be filled with air), the overall dielectric constant of the inner spacer can be decreased. A benefit of the present disclosure is to effectively reduce the overall dielectric constant of the inner spacer, thus reducing gate-to-source/drain coupling effects in the nano-sheet FET and improving device performance (e.g., speed) of the IC.

FIG. 1 is an isometric view of a device 100, according to some embodiments. Device 100 can have one or more nano-sheet FETs (e.g., nano-sheet FETs 101A and/or 101B), nano-wire FETs, finFETs, or any other type of FETs. Device 100 can be included in a microprocessor, memory cell, or other integrated circuit. The view of device 100 in FIG. 1 is shown for illustration purposes and may not be drawn to scale.

As shown in FIG. 1, device 100 can be formed on a substrate 102 and can include multiple vertical structures 106, multiple shallow trench isolation (STI) regions 138, multiple gate structures 110, and multiple interlayer dielectric (ILD) structures 130 formed on opposite sides of gate structure 110. The cross-sectional shapes of vertical structures 106, STI regions 138, gate structures 110, and ILD structures 130 shown in FIG. 1 are illustrative and are not intended to be limiting.

Substrate 102 can be a physical material on which vertical structures 106 can be formed. Substrate 102 can be a semiconductor material, such as silicon. In some embodiments, substrate 102 can include a crystalline silicon substrate (e.g., wafer). In some embodiments, substrate 102 can include (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic). In some embodiments, substrate 102 can include a glass substrate. In some embodiments, substrate 102 can include a flexible substrate made of, for example, plastic. In some embodiments, substrate 102 can include a crystalline substrate, where a top surface substrate 102 can be parallel to (100), (110), (111), or c-plane (0001) crystal plane.

STI regions 138 can provide electrical isolation to vertical structures 106 from each other and from neighboring active and passive elements (not illustrated herein) integrated with or deposited onto substrate 102. STI regions 138 can be made of a dielectric material. In some embodiments, STI regions 138 can include silicon oxide ($SiO_x$), silicon nitride ($SiN_x$), silicon oxynitride (SiON), fluorine-doped silicate glass (FSG), a low-k dielectric material, and/or other suitable insulating material. In some embodiments, STI regions 138 can include a multi-layered structure. In some embodiments, a liner (not shown in FIG. 1), made of any suitable insulating material, can be placed between STI region 138 and the adjacent vertical structures 106.

Vertical structure 106 can accommodate one or more FETs and can be traversed (e.g., along the x-direction) and through gate structures 110. For example, as illustrated in FIG. 1, two nano-sheet FETs 101A and 101B can reside on vertical structure 106. Although FIG. 1 illustrates two nano-sheet FETs 101A and 101B on vertical structure 106, any number of FETs can be accommodated on vertical structure 106. In some embodiments, vertical structure 106 can be oriented along <110>, <111>, or <100> crystal direction. Vertical structure 106 can include a buffer region 120 formed over substrate 102. In some embodiments, top surfaces of buffer regions 120 can be below or coplanar with top surfaces of STI regions 138. Vertical structure 106 can also include a channel region 122 and a source-drain region 124 respectively functioning as a current-carrying structure and a source/drain (S/D) region for a FET (e.g., nano-sheet FETs 101A and/or 101B) residing on vertical structure 106. In some embodiments, vertical structure 106 can include one or more inner spacers 108 to separate source-drain region 124 from gate structure 110 that traverses through vertical structure 106. The cross-sectional shapes of inner spacers 108, buffer regions 120, and channel regions 122 shown in FIG. 1 are illustrative and are not intended to be limiting.

Channel region 122 can be formed over buffer region 120 and can include at least one channel layer that is made of at least one semiconductor layer. For example, FIG. 1 illustrates six channel layers in channel region 122, where each of the six channel layers can include at least a silicon layer or a silicon germanium layer. Although FIG. 1 shows six channel layers in channel region 122, any number of channel layers can be included in channel region 122. Since vertical structure 106 can horizontally (e.g., in the x-direction) traverse through gate structure 110, a portion of channel region 122 can be formed under gate structure 110 and another portion of channel region 122 (covered by source-drain region 124; not shown in FIG. 1) can be formed horizontally (e.g., in the x-direction) outside gate structure 110. As a result, the portion of channel region 122 under gate structure 110 can be channels of a FET (e.g., nano-sheet FETs 101A and/or 101B) residing on vertical structure 106. In some embodiments, channel region 122 can be entirely formed under gate structure 110. In some embodiments, a top surface, side surfaces, and the bottom surface the portion of channel regions 122 under gate structure 110 can be in physical contact with gate structure 110. In some embodiments, a top surface, side surfaces, and a bottom surface of each channel layer in channel region 122 can be in physical contact with gate structure 110.

In some embodiments, channel region 122 can include a first portion and a second portion. The first portion can include alternating first channel layers and second channel layers and can connect to a source-drain region 124. The second portion can include the second channel layers (e.g., six channel layers under gate structure 110 shown in FIG. 1). The second channel layers from the first portion of channel region 122 can extend through the second portion of channel region 122. Gate structure 110 can be formed over the second portion of the channel region 122. In some embodiments, gate structure 110 can surround each of the second channel layers of the second portion of channel region 122.

Each of buffer region 120 and channel region 122 can include materials similar to substrate 102. For example, each of buffer region 120 and channel region 122 can include a semiconductor material having a lattice constant substantially close to (e.g., lattice constant mismatch within 1%) that of substrate 102. In some embodiments, each of buffer region 120 and channel region 122 can include material similar to or different from each other. In some embodiments, buffer region 120 can include an elementary semiconductor, such as silicon and germanium. In some embodiments, channel region 122 can include an alloy semiconductor, such as silicon germanium carbide, silicon germanium, gallium arsenic phosphide, gallium indium phosphide, gallium indium arsenide, gallium indium arsenic phosphide, aluminum indium arsenide, and aluminum gallium arsenide.

Each of buffer region 120 and channel region 122 can be p-type, n-type, or un-doped. In some embodiments, a portion of channel region 122 under gate structure 110 and another portion of channel region 122 horizontally (e.g., in the x-direction) outside gate structure 110 can have different doping types. For example, a portion of channel region 122 under gate structure 110 can be un-doped, and another portion of channel region 122 that is outside gate structure 110 can be n-type doped. In some embodiments, buffer region 120 and a portion of channel region 122 under gate structure can have the same doping type.

Source-drain region 124 can be formed over a portion of channel region 122 and over buffer region 120. For example, source-drain 124 can wrap around the other portion of channel region 122 that is horizontally (e.g., in the x-direction) outside gate structure 110. In some embodiments, channel region 122 and source-drain region 124 can be positioned above top surfaces of STI regions 138. In some embodiments, source-drain region 124 can be formed over buffer region 120 and adjacent to channel region 122. In some embodiments, bottom surfaces of channel region 122 and bottom surfaces of source-drain region 124 can be above or substantially coplanar with top surfaces of STI regions 138. The cross-sectional shapes of source-drain regions 124 shown in FIG. 1 is illustrative and are not intended to be limiting.

Source-drain region 124 can include an epitaxially-grown semiconductor material. In some embodiments, the epitaxially-grown semiconductor material can be the same material as the material of substrate 102. In some embodiments, the epitaxially-grown semiconductor material can include a different material from the material of substrate 102. The epitaxially-grown semiconductor material can include: (i) a semiconductor material, such as germanium (Ge) and silicon (Si); (ii) a compound semiconductor material, such as gallium arsenide and aluminum gallium arsenide; or (iii) a semiconductor alloy, such as silicon germanium (SiGe) and gallium arsenide phosphide. In some embodiments, source-drain regions 124 on different vertical structures 106 can have different material and/or doping type from each other. For example, device 100A can include a vertical structure 106 having a first source-drain region 124A and another vertical structure 106 having a second source-drain region 124B, where the first and the second source-drain regions 124A and 124B can include same or different semiconductor material or dopants.

Source-drain region 124 can be p-type or n-type doped. In some embodiments, source-drain region 124 can be doped with p-type dopants, such as boron, indium, gallium, zinc, beryllium, and magnesium. In some embodiments, source-drain region 124 can be doped with n-type dopants, such as phosphorus, arsenic, silicon, sulfur, and selenium. In some embodiments, each of n-type source-drain region 124 can have a plurality of n-type sub-regions. Except for the type of dopants, the plurality of n-type sub-regions can be similar to the respective plurality of p-type sub-regions, in thickness, relative Ge concentration with respect to Si, dopant concentration, and/or epitaxial growth process conditions.

Source-drain region 124 can be grown over channel regions 122 and/or buffer regions 120 via an epitaxial growth process. In some embodiments, source-drain regions 124 can be grown on portions of vertical structures 106 that are horizontally(e.g., in the x-direction) outside gate structures 110 via the epitaxial growth process. The epitaxial growth process for source-drain region 124 can include (i) chemical vapor deposition (CVD), such as low pressure CVD (LPCVD), rapid thermal chemical vapor deposition (RTCVD), metal-organic chemical vapor deposition (MOCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, source-drain region 124 can be grown by an epitaxial deposition/partial etch process, which repeats the epitaxial deposition/partial etch process at least once. Such repeated deposition/partial etch process is also called a "cyclic deposition-etch (CDE) process." In some embodiments, source-drain region 124 can be grown by selective epitaxial growth (SEG), where an etching gas can be added to promote the selective growth of semiconductor material on the exposed surfaces of vertical structure 106, but not on insulating material (e.g., dielectric material of STI regions 138).

Doping type of source-drain regions 124 can also be determined by introducing one or more precursors during the above-noted epitaxial growth process. For example, source-drain region 124 can be in-situ p-type doped during the epitaxial growth process using p-type doping precursors, such as diborane ($B_2H_6$) and boron trifluoride ($BF_3$). In some embodiments, source-drain region 124 can be in-situ n-type doped during an epitaxial growth process using n-type doping precursors, such as phosphine ($PH_3$) and arsine ($AsH_3$).

As shown in FIG. 1, gate structure 110 can be a vertical structure traversing along (e.g., along the y-direction) and through one or more vertical structures 106. Although FIG. 1 shows two gate structures 110 traversing six vertical structures 106, any number of gate structures 110 can be included in device 100, where each of the gate structures 110 can be parallel to each other and can traverse any number of vertical structures 106. In some embodiments, gate structure 110 can surround a portion of a top surface and a portion of side surfaces of channel region 122 (e.g., when 101A and 101B are FinFETs). In some embodiments, gate structure 110 can further be formed between each channel layer in channel region 122 (e.g., when 101A and 101B are nanosheet FETs or a nano-wire FETs). Gate structure 110 can include a gate electrode 114 and a dielectric layer 112 disposed between the surrounded channel region 122 and gate electrode 114. In some embodiments, gate electrode 114 formed between each channel layer in channel region 122 can be separated from source-drain region 124 via inner spacer 108. In some embodiments, gate structure 110 can have a horizontal dimension (e.g., gate length in the x-direction) that ranges from about 5 nm to about 200 nm. In some embodiments, gate structure 110 can be formed by a gate replacement process. In some embodiments, gate structure 110 can be formed by a gate first process.

Dielectric layer 112 can be adjacent to and in contact with gate electrode 114. Dielectric layer 112 can have a thickness ranging from about 1 nm to about 5 nm. Dielectric layer 112 can include silicon oxide and may be formed by CVD, atomic layer deposition (ALD), physical vapor deposition (PVD), e-beam evaporation, or any other suitable process. In some embodiments, dielectric layer 112 can include (i) a layer of silicon oxide, silicon nitride, and/or silicon oxynitride, (ii) a high-k dielectric material, such as aluminum oxide ($Al_2O_3$), hafnium oxide ($HfO_2$), hafnium aluminum oxide ($HfAlO_x$), titanium oxide ($TiO_2$), hafnium zirconium oxide ($HfZrO_x$), tantalum oxide ($Ta_2O_3$), hafnium silicate ($HfSiO_4$), hafnium silicon oxide ($HfSiO_x$), zirconium oxide ($ZrO_2$), zirconium silicate ($ZrSiO_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers may be formed by ALD and/or other suitable methods. In some embodiments, dielectric layer 112 can include a single layer or a stack of insulating material layers. Based on the disclosure herein, other materials and formation methods for dielectric layer 112 are within the scope and spirit of this disclosure.

Gate electrode 114 can include a gate work function metal layer (not shown) and a gate metal fill layer (not shown). In some embodiments, the gate work function metal layer can be disposed on dielectric layer 112. The gate work function metal layer can include a single metal layer or a stack of metal layers. The stack of metal layers can include metals having work functions similar to or different from each other. In some embodiments, the gate work function metal layer can include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. The gate work function metal layer can be formed using a suitable process, such as ALD, CVD, PVD, plating, or combinations thereof. In some embodiments, the gate work function metal layer can have a thickness ranging from about 2 nm to about 15 nm. Based on the disclosure herein, other materials, formation methods, and thicknesses for the gate work function metal layer are within the scope and spirit of this disclosure.

The gate metal fill layer can include a single metal layer or a stack of metal layers. The stack of metal layers can include metals different from each other. In some embodiments, the gate metal fill layer can include a suitable conductive material, such as Ti, silver (Ag), Al, titanium aluminum nitride (TiAlN), tantalum carbide (TaC), tantalum carbo-nitride (TaCN), tantalum silicon nitride (TaSiN), manganese (Mn), zirconium(Zr), titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and/or combinations thereof. The gate metal fill layer can be formed by ALD, PVD, CVD, or other suitable deposition process. Based on the disclosure herein, other materials and formation methods for the gate metal fill layer are within the scope and spirit of this disclosure.

Inner spacer 108 can include one or more insulating layers to provide electrical isolation between source-drain region 124 and gate structure 110. For example, both gate electrode 114 and inner spacer 108 can be formed between each channel layers of channel region 120, where inner spacer 108 can separate gate electrode 114 from source-drain region 124. Each layer in inner spacer 108 can include an insulating material, such as a low-k material or a high-k material. In some embodiments, inner spacer 108 can include one or more insulating layers and a void structure (not shown in FIG. 1), where the void structure can be embedded in the one or more insulating layer. Such void structure can have a low dielectric constant, such as about 1.0 (e.g., the void structure can be filled with air), and therefore can drastically reduce an overall dielectric constant of inner spacer 108. Each layer of inner spacer 108 can have a thickness ranging from about 3 nm to about 20 nm. Based on the disclosure herein, other insulating materials and thicknesses for inner spacer 108 are within the scope and spirit of this disclosure.

ILD structure 130 can include one or more insulating layers to provide electrical isolation to structural elements it surrounds or covers—for example, gate structure 110, source-drain regions 124, and source/drain (S/D) contact structures (not shown) formed adjacent to the gate structures. Each of the insulating layers can include an insulating material, such as silicon oxide, silicon dioxide ($SiO_2$), silicon oxycarbide (SiOC), silicon oxynitride (SiON), silicon oxy-carbon nitride (SiOCN), and silicon carbonitride (SiCN), that can be formed by low pressure chemical vapor deposition (LPCVD), plasma enhanced chemical vapor deposition (PECVD), chemical vapor deposition (CVD), flowable CVD (FCVD), or high-aspect-ratio process (HARP). Each of the one or more insulating layers in ILD structure 130 can have a thickness ranging from about 50 nm to about 200 nm. Based on the disclosure herein, other insulating materials, thicknesses, and formation methods for ILD structure 130 are within the scope and spirit of this disclosure.

Figure 2A:
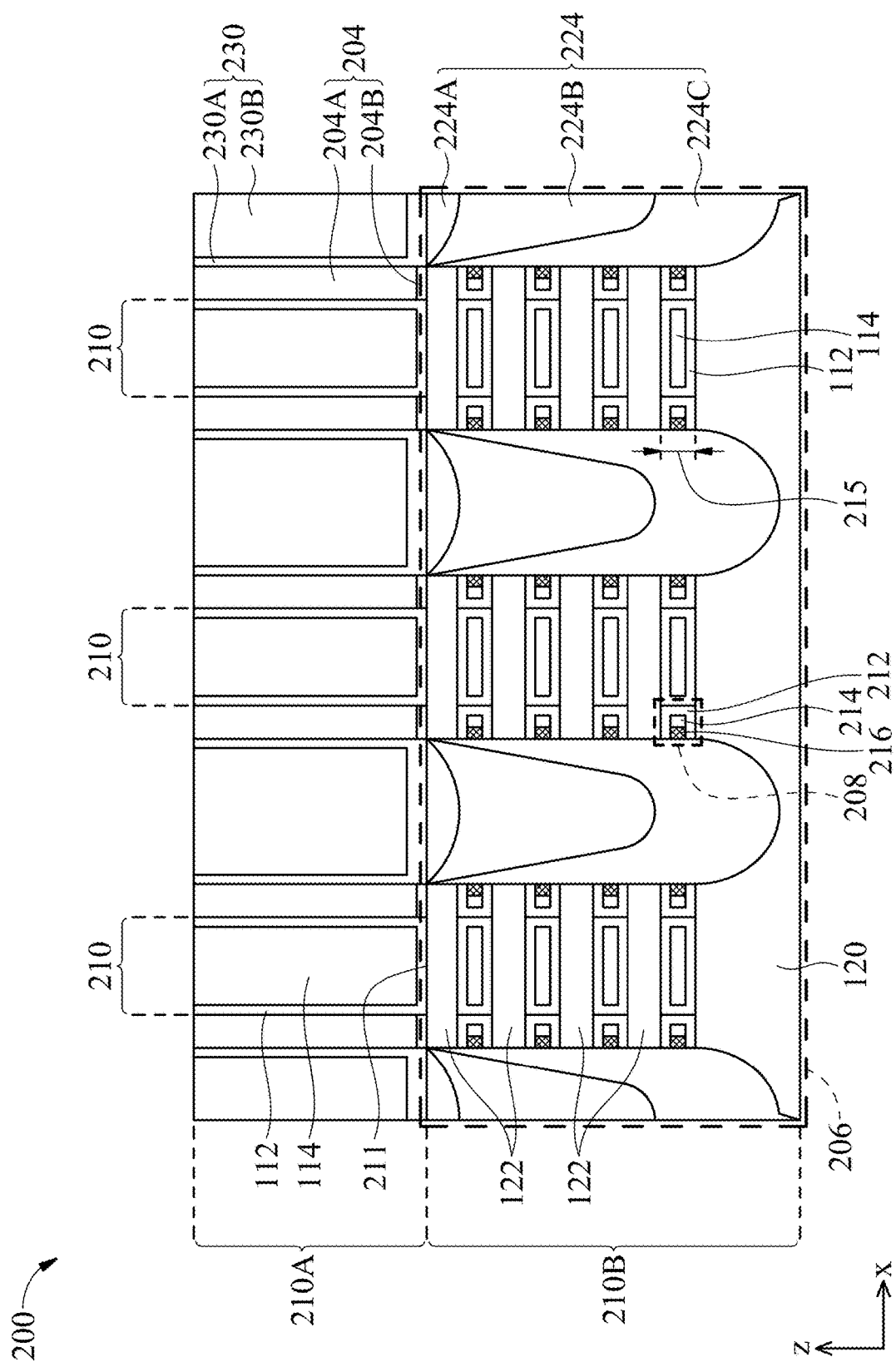
FIGS. 2A and 2B are cross-sectional views of a semiconductor device, according to some embodiments.
Figure 2B:
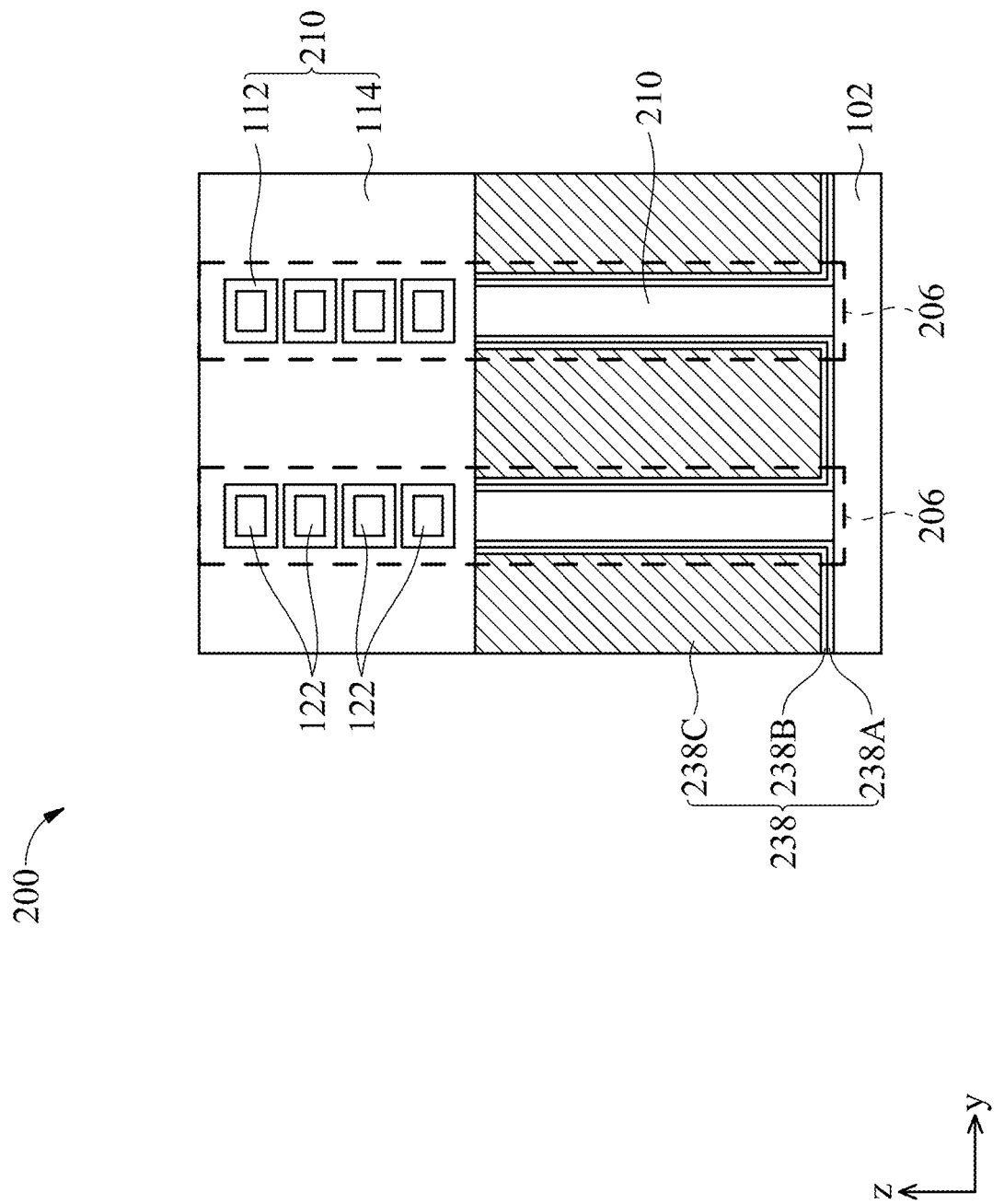

FIGS. 2A and 2B shows cross-sectional views of a device 200, according to some embodiments. Device 200 can be an embodiment of device 100. The discussion of device 100 applies to device 200 unless mentioned otherwise. FIG. 2A shows a cross-sectional view along line B-B of device 100 of FIG. 1, according to some embodiments. FIG. 2B shows a cross-sectional view along line D-D of device 100 of FIG. 1, according to some embodiments. The discussion of elements with the same annotations in FIGS. 1 and 2A-2B applies to each other unless mentioned otherwise.

In referring to FIGS. 2A and 2B, device 200 can include STI regions 238, one or more gate structures 210, multiple ILD structures 230 formed on opposite sides of gate structure 210, and one or more vertical structure 206. The discussion of STI region 138, gate structure 110, ILD structure 130, and vertical structure 106 can be respectively applied to STI region 238, gate structure 210, ILD structure 230, and vertical structure 206, unless mentioned otherwise. Although devices 100 and 200 illustrate different numbers of gate structures 110 and 210 (e.g., FIGS. 2A-2B show three gate structures 210) and different numbers of channel layers (e.g., FIGS. 2A-2B show four channel layers in channel region 122) within channel region 122, the number of gate structures 110 and 210, and the number of channel layers within channel region 122 can be the same between devices 100 and 200.

In referring to FIG. 2A, ILD structure 230 can include a contact etch stop layer (CESL) 230A and an insulating layer 230B disposed over CESL 230A, according to some embodiments. CESL 230A can be configured to protect gate structure 210 and/or portions of source-drain regions 224 that are not in contact with S/D contact structures (not shown); this protection can be provided, for example, during formation of insulating layer 230B and/or the S/D contact structures.

CESL 230A can be disposed over sides of gate structure 210. In some embodiments, CESL 230A can include, for example, silicon nitride ($SiN_x$), silicon oxide ($SiO_x$), silicon oxynitride (SiON), silicon carbide (SiC), silicon carbonitride (SiCN), boron nitride (BN), silicon boron nitride (SiBN), silicon carbon boron nitride (SiCBN), or a combination thereof. In some embodiments, CESL 230A can include silicon nitride or silicon oxide formed by low pressure chemical vapor deposition (LPCVD), plasma enhanced chemical vapor deposition (PECVD), chemical vapor deposition (CVD), or silicon oxide formed by a high-aspect-ratio process (HARP). In some embodiments, CESL 230A can have a thickness ranging from about 3 nm to 10 nm or from about 10 nm to about 30 nm. Based on the disclosure herein, other materials, formation methods, and thicknesses for CESL 230A are within the scope and spirit of this disclosure.

Insulating layer 230B can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide may be deposited using flowable CVD (FCVD). In some embodiments, the dielectric material can be silicon oxide. In some embodiments, insulating layer 230B can have a thickness ranging from about 50 nm to about 200 nm. Based on the disclosure herein, other materials, thicknesses, and formation methods for insulating layer 230B are within the scope and spirit of this disclosure.

In referring to FIG. 2A, gate structure 210 can surround or wrap channel region 122 and can include dielectric layer 112, gate electrode 114, and a gate spacer 204. In some embodiments, gate structure 210's dielectric layer 112 can contact a top, side portions (not shown), and a bottom of each channel layer in channel region 122, while gate structure 210's gate electrode 114 can be formed over and in contact with dielectric layer 112. Gate structure 210 can include an upper portion 210A and a lower portion 210B, where a top 211 of channel region 122 can be positioned between upper portion 210A and lower portion 210B. Dielectric layer 112 and gate electrode 114 in upper portion 210A can be both formed over channel region 122. Dielectric layer 112 and gate electrode 114 in lower portion 210B can be both formed over side portions (not shown) and a bottom of channel region 122. In some embodiments, dielectric layer 112 and gate electrode 114 in lower portion 210B can be both formed between each channel layer in channel region 122. In some embodiments, dielectric layer 112 and gate electrode 114 in lower portion 210B can be both formed between two vertically (e.g., in the z-direction) adjacent channel layers in channel region 122. In some embodiments, dielectric layer 112 and gate electrode 114 in lower portion 210B can be formed over buffer region 120.

Gate spacer 204 can be formed at upper portion 210A to electrically insulate upper portion 210A's gate electrode 114 from source-drain region 124 and/or the S/D contact structure (not shown). Gate spacer 204 can be in contact with dielectric layer 112 and/or gate electrode 114. For example, as shown in FIG. 2A, a side of gate spacer 204 can physically contact dielectric layer 112 and/or gate electrode 114, while an opposite side of gate spacer 204 can be in contact with ILD structure 230, source-drain region 124, or the S/D contact structures (not shown in FIG. 2A). Gate spacer 204 can be made of an insulating material, such as a low-k material with a dielectric constant less than 3.9 (e.g., less than 3.5, 3.0, or 2.8). For example, gate spacer 204 can be made of silicon oxide, silicon nitride, or a combination thereof. In some embodiments, gate spacer 204 can include a multilayer structure. For example, as shown in FIG. 2A, gate spacer 204 can include a spacer layer 204A and a spacer layer 204B. In some embodiments, spacer layers 204A and 204B can be in contact with ILD structure 130. In some embodiments, each of spacer layers 204A-204B can have a thickness ranging from about 7 nm to about 10 nm. Based on the disclosure herein, other materials and thicknesses for gate spacer 204 are within the scope and spirit of this disclosure.

Vertical structure 206 can include buffer region 120, channel region 122, source-drain region 224, and an inner spacer 208. The discussion of source-drain region 124 and inner spacer 108 can be respectively applied to source-drain region 224 and inner spacer 208, unless mentioned otherwise. In referring to FIG. 2A, inner spacer 208 can be formed adjacent to gate structure 210's lower portion 210B. In some embodiments, inner spacer 208 can be formed between source-drain region 224 and lower portion 210B's gate electrode 114. In some embodiments, gate structure 210's lower portion 210B can be horizontally (e.g., in the x-direction) sandwiched by two inner spacers 208. In some embodiments, inner spacer 208 can be formed between two vertically (e.g., in the z-direction) adjacent channel layers of channel region 122. In some embodiments, inner spacer 208 can physically contact source-drain region 224, an adjacent channel layer of channel region 122, or gate structure 210's lower portion 210B. The cross-sectional shapes of vertical structure 206, including inner spacers 208, and source-drain region 224 shown in FIGS. 2A and 2B are illustrative and are not intended to be limiting.

In referring to FIG. 2A, inner spacer 208 can include a dielectric layer 212, a dielectric layer 216, and an void structure 214 formed between dielectric layers 212 and 216. Dielectric layer 212 can contact gate structure 210's lower portion 210B. In some embodiments, inner spacer 208 can be formed between two vertically (e.g., in the z-direction)

adjacent channel layers of channel region 122, where dielectric layer 212 can contact one or more of the two vertically adjacent channel layers. In some embodiments, dielectric layer 212 can be formed under gate structure 210's upper portion 210A. In some embodiments, dielectric layer 212 can physically contact source-drain region 224. Dielectric layer 212 can include a low-k material with a dielectric constant less than about 3.9 (e.g., about 3.5, about 3.0, or about 2.8). For example, dielectric layer 212 can include silicon oxide or silicon nitride. In some embodiments, dielectric layer 212 can include an amorphous silicon. In some embodiments, dielectric layer 212 can have a thickness ranging from about 1 nm to about 5 nm. Other material and thickness for dielectric layer 212 are within the scope and limit of this disclosure.

Dielectric layer 216 can be formed over dielectric layer 212. In some embodiments, dielectric layer 216 can be formed between source-drain region 224 and dielectric layer 212. In some embodiments, dielectric layer 216 can physically contact source-drain region 224. In some embodiments, a portion of dielectric layer 216 can be under gate structure 210's upper portion 210A, while another portion of dielectric layer 216 can be horizontally (e.g., in the x-direction) outside gate structure 210's upper portion 210A. Dielectric layer 216 can include an insulating material, such as a low-k material or a high-k material. In some embodiments, dielectric layer 216 can include an oxide layer. In some embodiments, dielectric layer 216 can include a silicon-germanium oxide layer, where an atomic composition of germanium in the silicon germanium oxide can range from about 10% to about 80%. In some embodiments, dielectric layer 216 can have a thickness ranging from about 3 nm to about 15 nm or from about 5 nm to about 10 nm.

Figure 11:
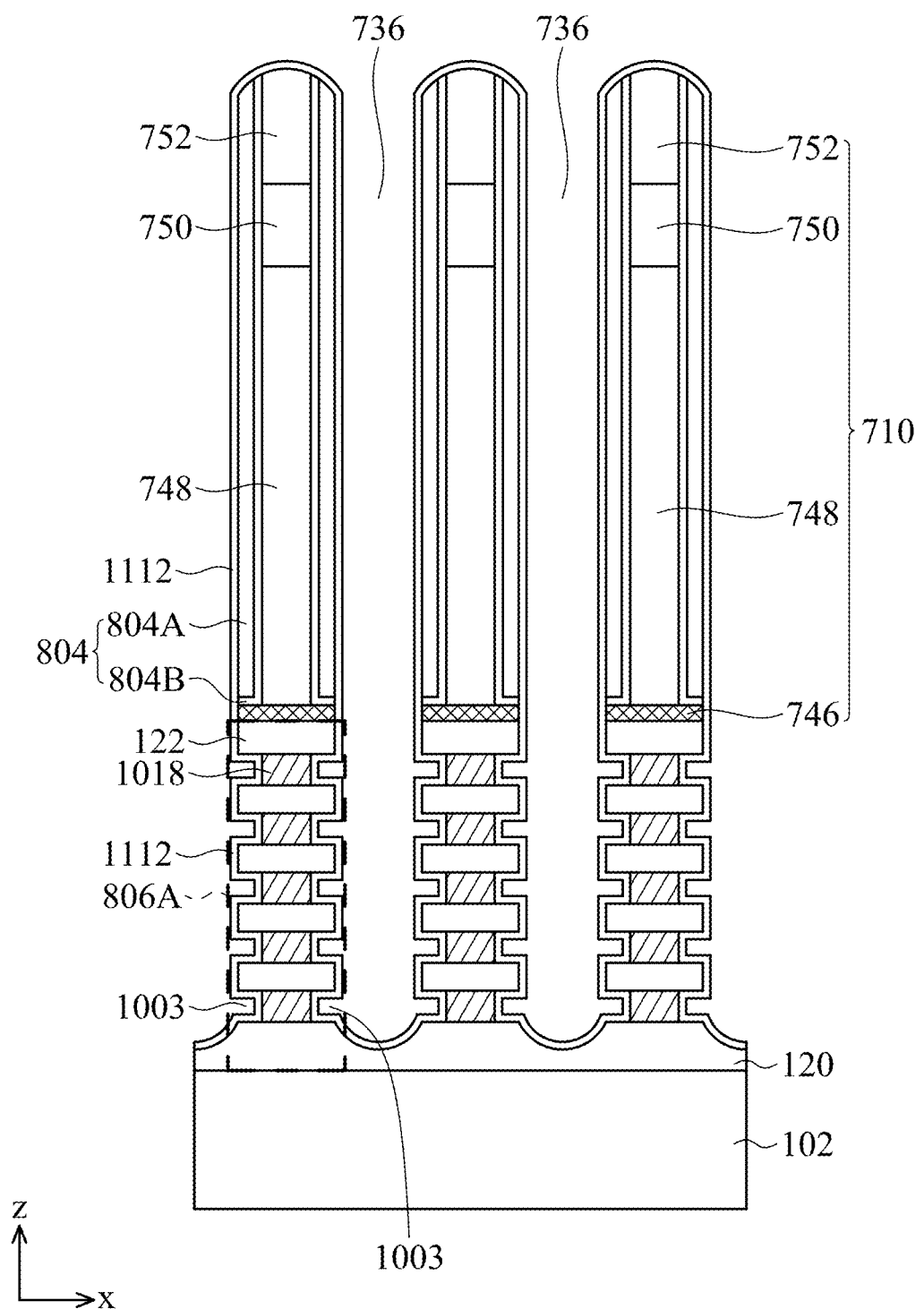

In some embodiments, dielectric layer 212 can include a recess structure 215 (e.g., substantially identical to recess structure 1103 shown in FIG. 11), where dielectric layer 216 can be formed at an opening of the recess structure 215. Dielectric layer 216 can seal the opening of recess structure 215 to form void structure 214. In other words, void structure 214 can be enclosed by dielectric layers 212 and 216. In some embodiments, dielectric layer 216 can seal two vertically (e.g., in the z-direction) adjacent channel layers to form void structure 214. In some embodiments, dielectric layer 216 can seal dielectric layer 212 to form void structure 214. In some embodiments, dielectric layer 216 can be disposed between void structure 214 and source-drain region 224. In some embodiments, dielectric layer 212 can be disposed between void structure 214 and gate structure 210's lower portion 210B. In some embodiments, dielectric layer 212 can be disposed between void structure 214 and two vertically (e.g., in the z-direction) adjacent channel layers of channel region 122. Void structure 214 can be a sphere-like shape, a cubic-like shape, or any other irregular shapes. Dimensions of void structure 214 can range from about 1 nm to about 8 nm or about 2 nm to about 6 nm in the x-direction, y-direction, and z-direction. Other dimensions and shapes for void structure 214 are within the scope and limit of this disclosure.

In some embodiments, inner spacer 208 can include dielectric layer 216 and void structure 214, where dielectric layer 216 can seal two vertically (e.g., in the z-direction) adjacent channel layers of channel region 120 and void structure 214 can be disposed horizontally (e.g., in the x-direction) between dielectric layer 216 and gate structure 210's lower portion 210B. Namely, such inner spacer 208 does not include dielectric layer 212, and void structure 214 can be enclosed by dielectric layer 216, the two vertically adjacent channel layers, and gate structure 210's lower portion 210B.

In referring to FIG. 2A, source-drain region 224 can have multiple sub-regions 224A-224C that can include SiGe and can differ from each other based on, for example, doping concentration, epitaxial growth process conditions, and/or relative concentration of Ge with respect to Si. Although FIG. 2A indicates three sub-regions 224A-224C in source-drain region 224, any number of sub-regions can be included in source-drain region 224. In some embodiments, each of sub-regions 224A-224C may have thicknesses similar to or different from each other and thicknesses ranging from about 0.5 nm to about 5 nm. In some embodiments, the atomic percent Ge in sub-regions closest to base region 120 (e.g., sub-region 224C) can be smaller than that in sub-regions 224A and 224B farthest from base region 120. In some embodiments, sub-regions 224A (e.g., closest to top 211) can include Ge ranging from about 15 atomic percent to about 35 atomic percent, while sub-regions 224B and 224C (e.g., farthest from top 211) can include Ge ranging from about 25 atomic percent to about 50 atomic percent with any remaining atomic percent being Si in the sub-regions.

Sub-regions 224A-224C can be epitaxially grown under a pressure from about 10 Torr to about 300 Torr and at a temperature from about 500° C. to about 700° C. using reaction gases, such as HCl as an etching agent, $GeH_4$ as Ge precursor, dichlorosilane (DCS) and/or $SiH_4$ as Si precursor, $H_2$, and/or $N_2$. To achieve different concentrations of Ge in the multiple sub-regions, the ratio of a flow rate of Ge to Si precursors can be varied during their respective growth process, according to some embodiments. For example, a Ge to Si precursor flow rate ratio ranging from about 9 to about 25 can be used during the epitaxial growth of the sub-regions closest to top 211, while a Ge to Si precursor flow rate ratio less than about 6 can be used during the epitaxial growth of the sub-regions farthest from top 211.

Sub-regions 224A-224C can have varying dopant concentrations with respect to each other, according to some embodiments. For example, sub-region 224A (e.g., closest to base region 120) can be undoped or can have a dopant concentration (e.g., dopant concentration less than about $8 \times 10^{20}$ atoms/cm$^3$) less than that (e.g., dopant concentration ranging from about $8 \times 10^{20}$ to about $3 \times 10^{22}$ atoms/cm$^3$) of sub-regions 224B and 224C (e.g., farthest from base region 120). Other materials, thicknesses, Ge concentrations, and dopant concentrations for sub-regions (e.g., sub-regions 224A-224C) of source-drain region 224 are within the scope and spirit of this disclosure.

In referring to FIG. 2B, each vertical structure 206 can be disposed vertically over substrate 102, and laterally (e.g., in the y-direction) between STI regions 238, where each channel layer in channel region 122 of each vertical structure 206 can be surrounded by gate structure 210. STI regions 238 can include first and second protective liners 238A-238B and an insulating layer 238C disposed on second protective liner 238B. First and second protective liners 238A-238B can include materials different from each other. Each of first and second protective liners 238A-238B can include an oxide or a nitride material. In some embodiments, first protective liner 238A can include a nitride material, and second protective liner 238B can include an oxide material and can prevent oxidation of sidewalls of vertical structure 206 during the formation of insulating layer 238C. In some embodiments, insulating layer 238C can include silicon oxide, silicon nitride, silicon oxynitride, fluorine-doped silicate glass (FSG), a low-k dielectric material, and/or other suitable insulating materials. In some embodiments, first and second protective liners 238A-238B each can have a thickness ranging from about 1 nm to about 2 nm.

Figure 3:
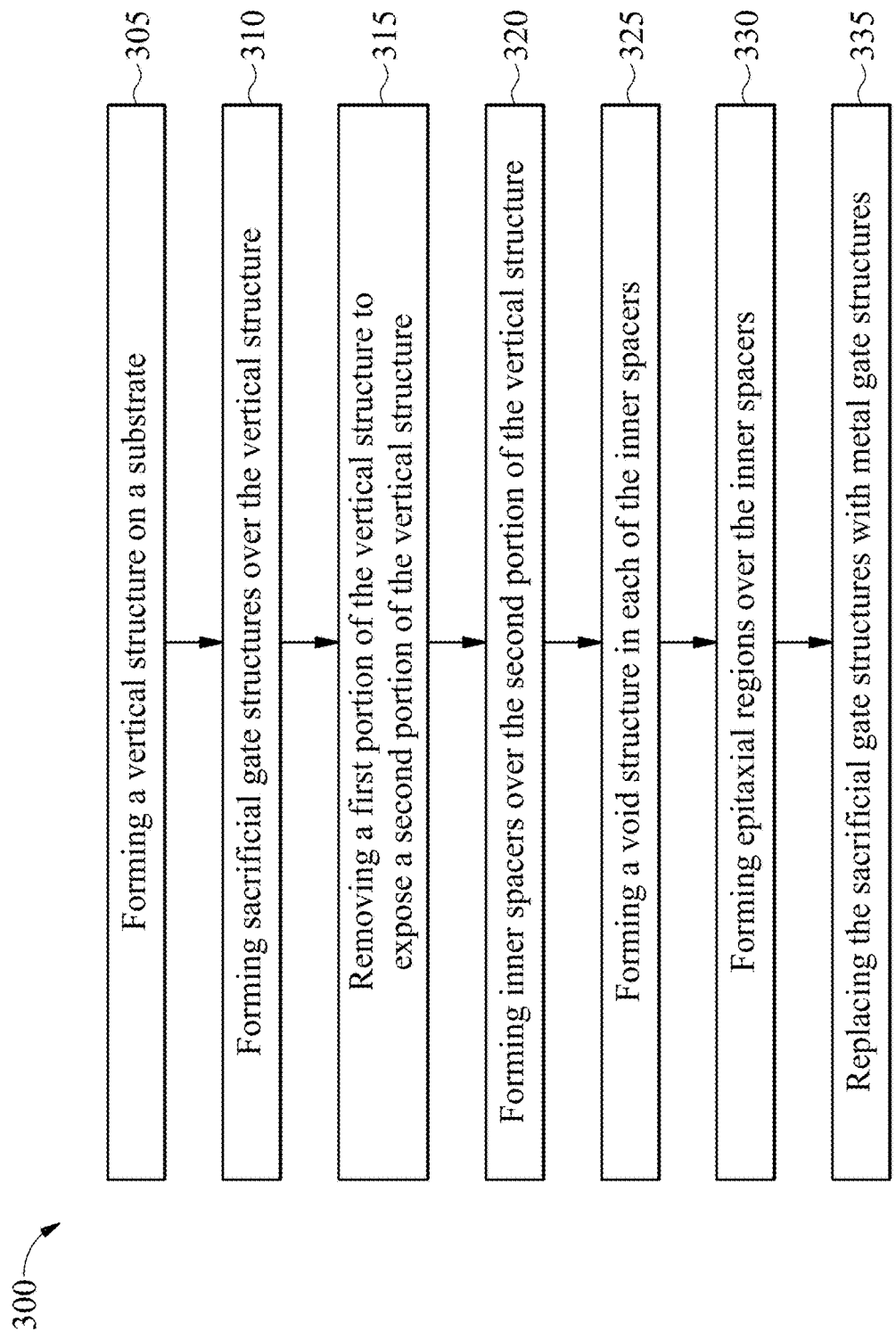
FIG. 3 is flow diagram of a method for fabricating a semiconductor device, according to some embodiments.

FIG. 3 is a flow diagram of a method 300 for fabricating device 200 as described with reference to FIGS. 1 and 2A-2B, according to some embodiments. For illustrative purposes, the operations illustrated in FIG. 3 will be described with reference to the example fabrication process for fabricating device 200 as illustrated in FIGS. 4A-7A, 4B-7B, 4C-6C, and 8-18. FIGS. 4A-7A are isometric views of device 200 at various stages of its fabrication, according to some embodiments. FIGS. 4B-7B and 8-18 are cross-sectional views along line D-D of the structure of FIG. 4A at various stages of its fabrication, according to some embodiments. FIGS. 4C-6C are cross-sectional views along line B-B of the structure of FIG. 4A at various stages of its fabrication, according to some embodiments. Operations can be performed in a different order or not performed depending on specific applications. It should be noted that method 300 does not manufacture a complete device 200. Accordingly, it is understood that additional processes may be provided before, during, and after method 300, and that some other processes may only be briefly described herein. Elements in FIGS. 4A-7A, 4B-7B, 4C-6C, and 8-18 with the same annotations as elements in FIGS. 1 and 2A-2B are described above.

Figure 4A:
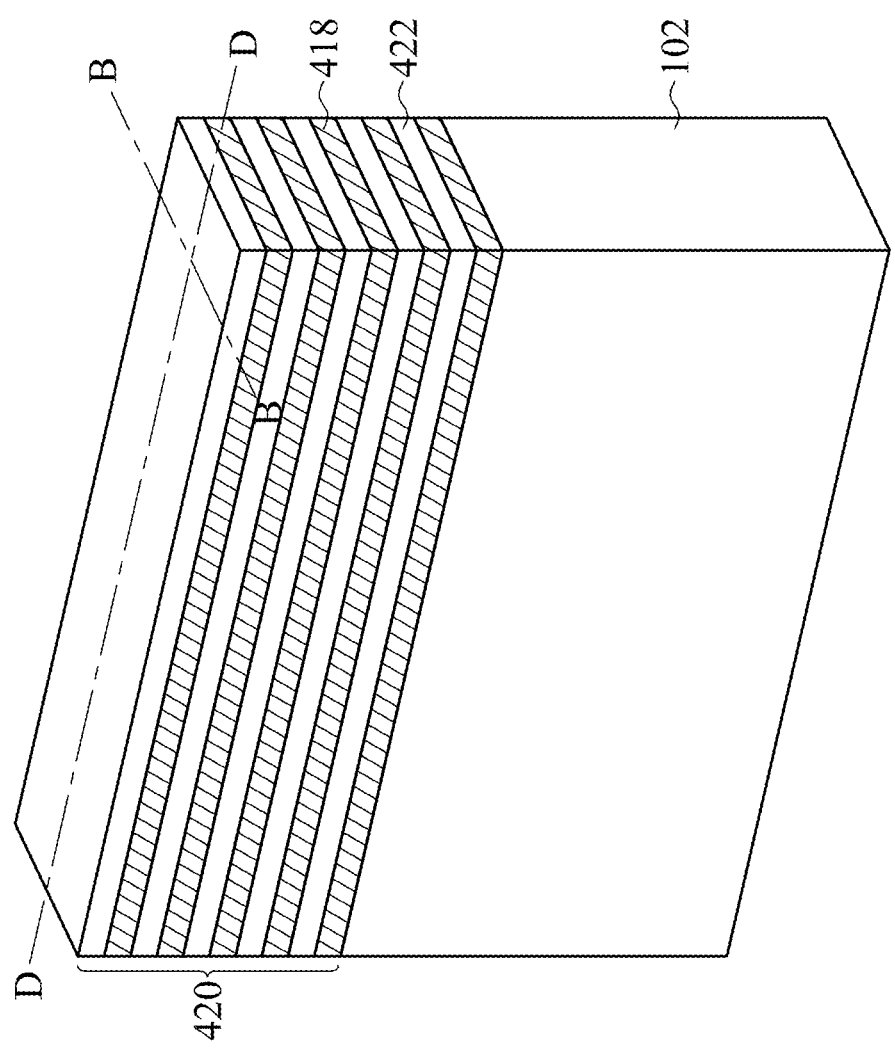
FIGS. 4A, 5A, 6A, and 7A are isometric views of a semiconductor device at various stages of its fabrication process, according to some embodiments.
Figure 4C:
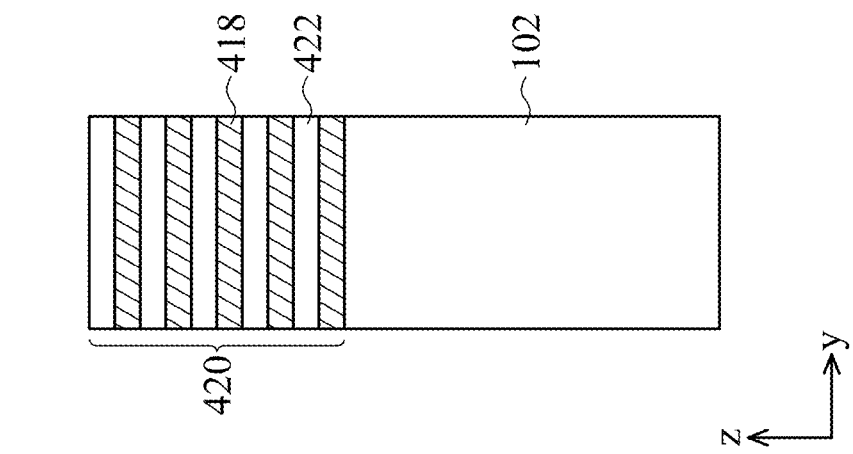
FIGS. 4B, 5B, 6B, 7B, 4C, 5C, 6C, and 8-18 are cross-sectional views of a semiconductor device at various stages of its fabrication process, according to some embodiments.
Figure 4B:
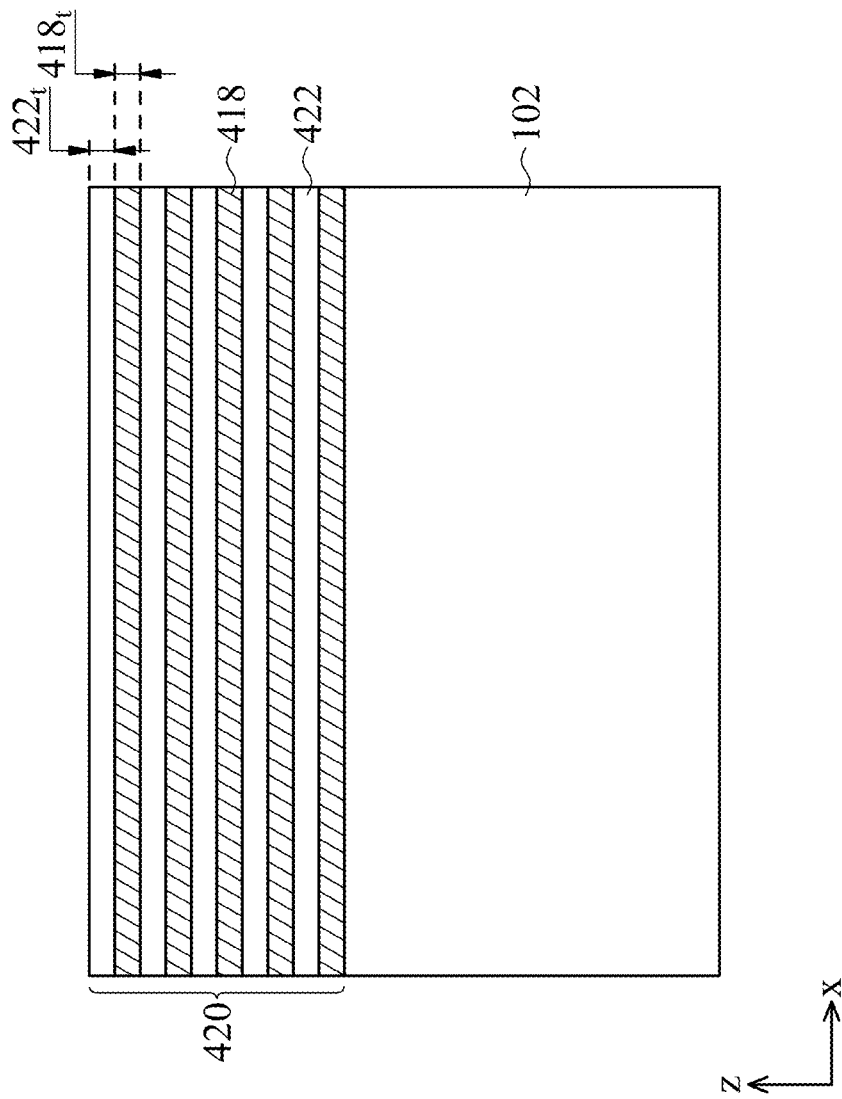
Figure 5A:
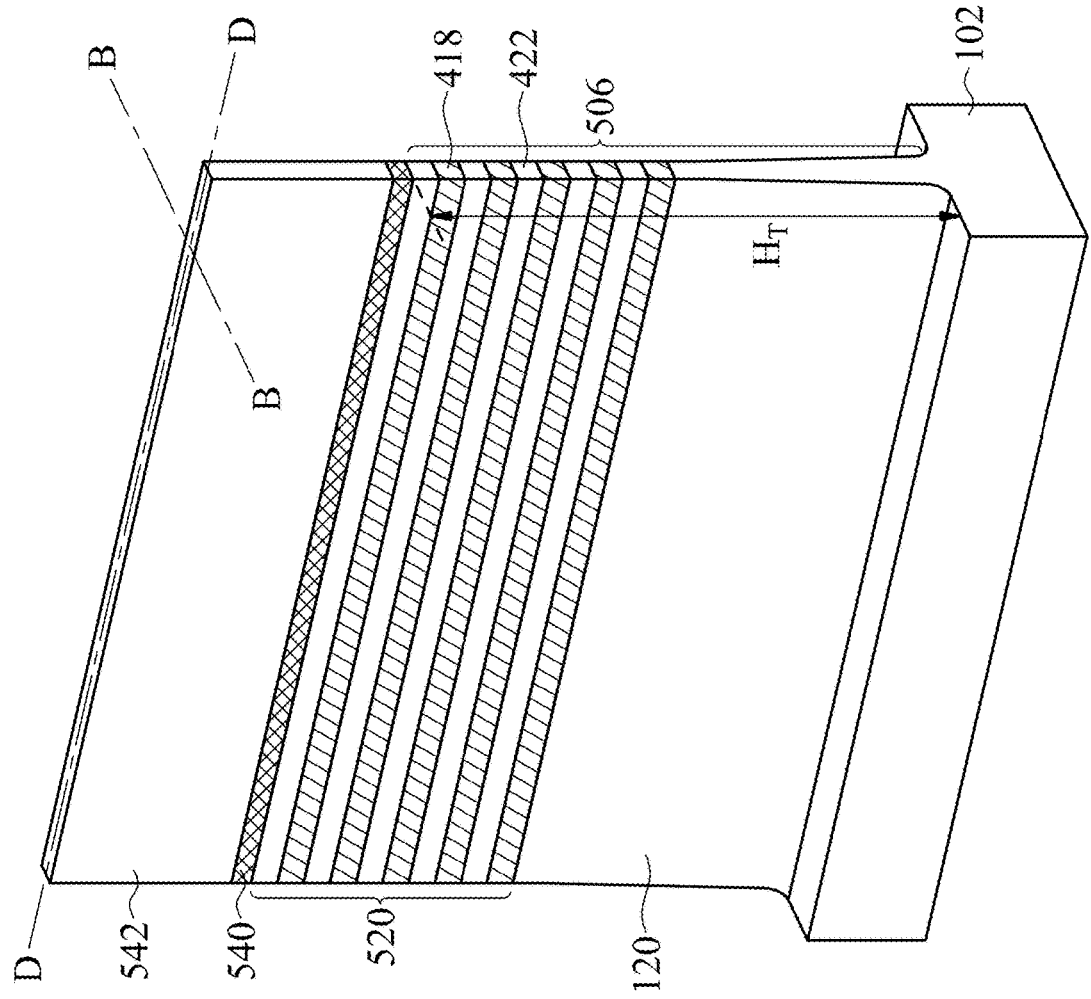
Figure 5C:
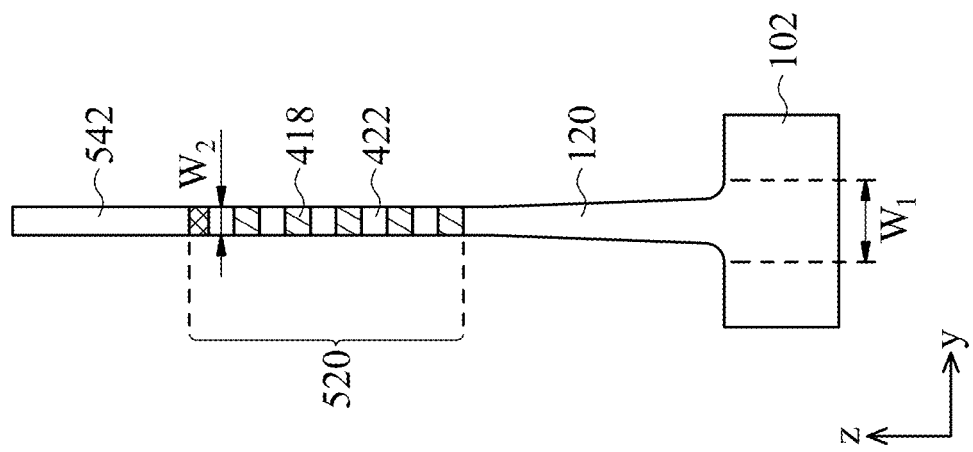
Figure 5B:
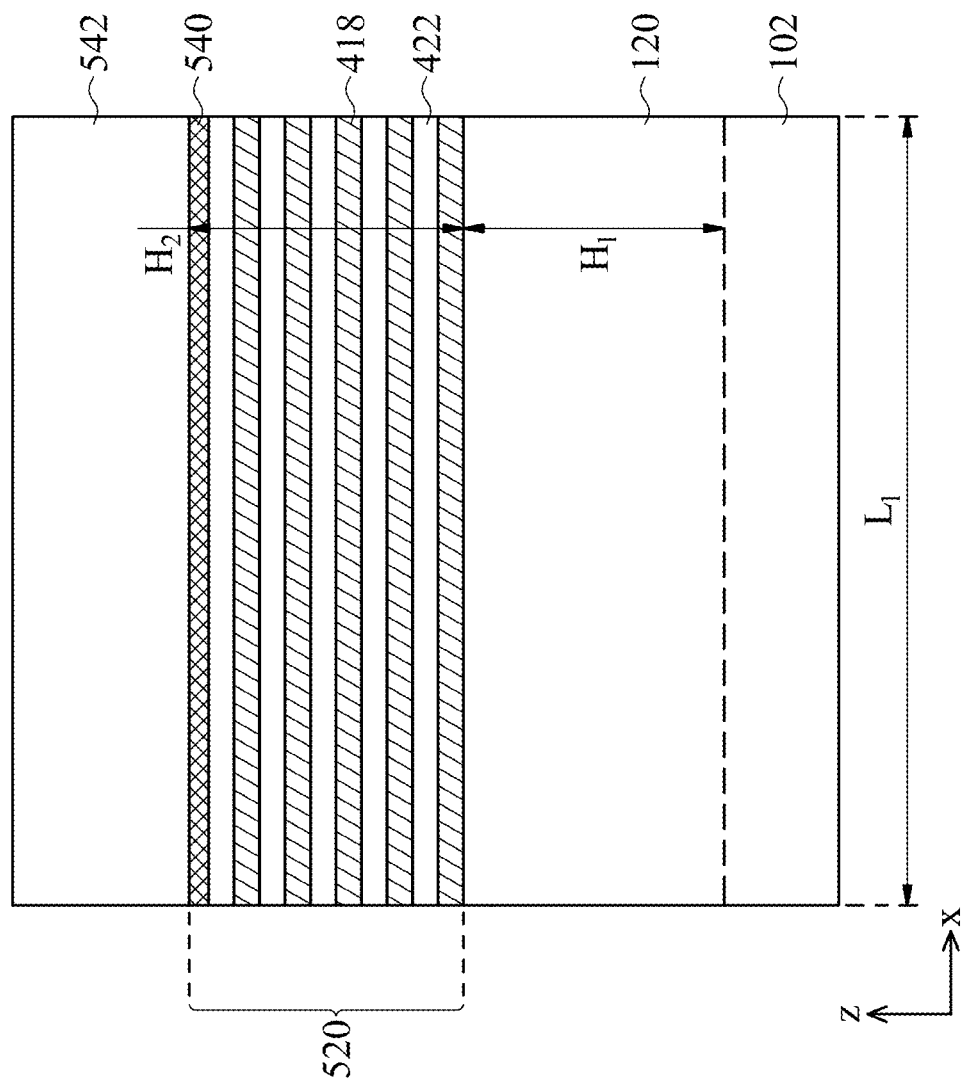

Referring to FIG. 3, in operation 305, a vertical structure is formed on a substrate. For example, vertical structure 506 (shown in FIG. 5A) with base region 120 and stacked fin portion 520 can be formed on substrate 102 as described with reference to FIGS. 4A-5A, 4B-5B, and 4C-5C. The formation of vertical structure 506 can include the formation of a stacked layer 420 on substrate 102 as shown in FIGS. 4A-4C. Stacked layer 420 can include first and second semiconductor layers 418 and 422 stacked in an alternating configuration. Each of first and second semiconductor layers 418 and 422 can be epitaxially grown on its underlying layer and can include semiconductor materials different from each other. In some embodiments, first and second semiconductor layers 418 and 422 can include semiconductor materials with oxidation rates and/or etch selectivity different from each other.

In some embodiments, first and second semiconductor layers 418 and 422 can include materials similar to or different from substrate 102. In some embodiments, each of first and second semiconductor layers 418 and 422 can include silicon germanium (SiGe) with Ge ranging from about 25 atomic percent to about 50 atomic percent (e.g., about 30 atomic percent, 35 atomic percent, or about 45 atomic percent) with any remaining atomic percent being Si or can include Si without any substantial amount of Ge. In some embodiments, first semiconductor layer 418 can include silicon germanium (SiGe) with Ge ranging from about 25 atomic percent to about 50 atomic percent, and second semiconductor layer 422 can include silicon germanium (SiGe) with Ge ranging from about 0 atomic percent to about 15 atomic percent. In some embodiments, first semiconductor layer 418 can include silicon germanium, while second semiconductor layer 422 can include silicon.

First and/or second semiconductor layers 418 and 422 can be undoped or can be in-situ doped during their epitaxial growth process using (i) p-type dopants, such as boron, indium, or gallium; and/or (ii) n-type dopants, such as phosphorus or arsenic. For p-type in-situ doping, p-type doping precursors, such as $B_2H_6$, $BF_3$, and/or other p-type doping precursors can be used. For n-type in-situ doping, n-type doping precursors, such as $PH_3$, $AsH_3$, and/or other n-type doping precursor can be used. First and second semiconductor layers 418 and 422 can have respective vertical dimensions 418t and 422t (e.g., thicknesses along the z-direction), each ranging from about 6 nm to about 10 nm (e.g., about 7 nm, about 8 nm, or about 9.5 nm). Vertical dimensions 418t and 422t can be equal to or different from each other.

The formation of vertical structure 506 can further include etching the structure of FIG. 4A through patterned hard mask layers 540 and 542 (shown in FIGS. 5A-5C) formed on stacked layer 420 of FIG. 4A. In some embodiments, hard mask layer 540 can be a thin film including silicon oxide formed, for example, using a thermal oxidation process. In some embodiments, hard mask layer 542 can be formed of silicon nitride using, for example, LPCVD or PECVD. The etching of the structure of FIG. 4A can include a dry etch, a wet etch process, or a combination thereof. The dry etch process can include using etchants having an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable etching gases and/or plasmas, or combinations thereof. The wet etch process can include etching in diluted hydrofluoric acid (DHF), potassium hydroxide (KOH) solution, ammonia, a solution containing hydrofluoric acid (HF), nitric acid ($HNO_3$), acetic acid ($CH_3COOH$), or combinations thereof.

In some embodiments, base region 120 and stacked fin portion 520 can have respective vertical dimensions $H_1$ and $H_2$ (e.g., heights along the z-direction), each ranging from about 40 nm to about 60 nm (e.g., about 45 nm, about 50 nm, or about 55 nm). Vertical dimensions $H_1$ and $H_2$ can be equal to or different from each other and can have values such that the sum of $H_1$ and $H_2$ (i.e., total height $H_T$ of vertical structure 506) can range from about 80 nm to about 120 nm (e.g., about 85 nm, about 90 nm, about 100 nm, or about 115 nm). In some embodiments, vertical structure 506 can have a horizontal dimension $L_1$ (e.g., length along the x-direction) ranging from about 100 nm to about 1 μm (e.g., about 200 nm, about 300 nm, about 500 nm, about 750 nm, or about 900 nm). In some embodiments, vertical structure 506 can have a tapered cross-section along a YZ-plane with a horizontal dimension $W_1$ (e.g., width) of base region 120 (e.g., along the y-direction) being greater than a horizontal dimension $W_2$ of stacked fin portion 520 (e.g., along the y-direction). Horizontal dimension $W_1$ and $W_2$ can range from about 6 nm to about 20 nm (e.g., about 6 nm, about 8 nm, about 10 nm, about 15 nm, about 17 nm, or about 20 nm).

Figure 6A:
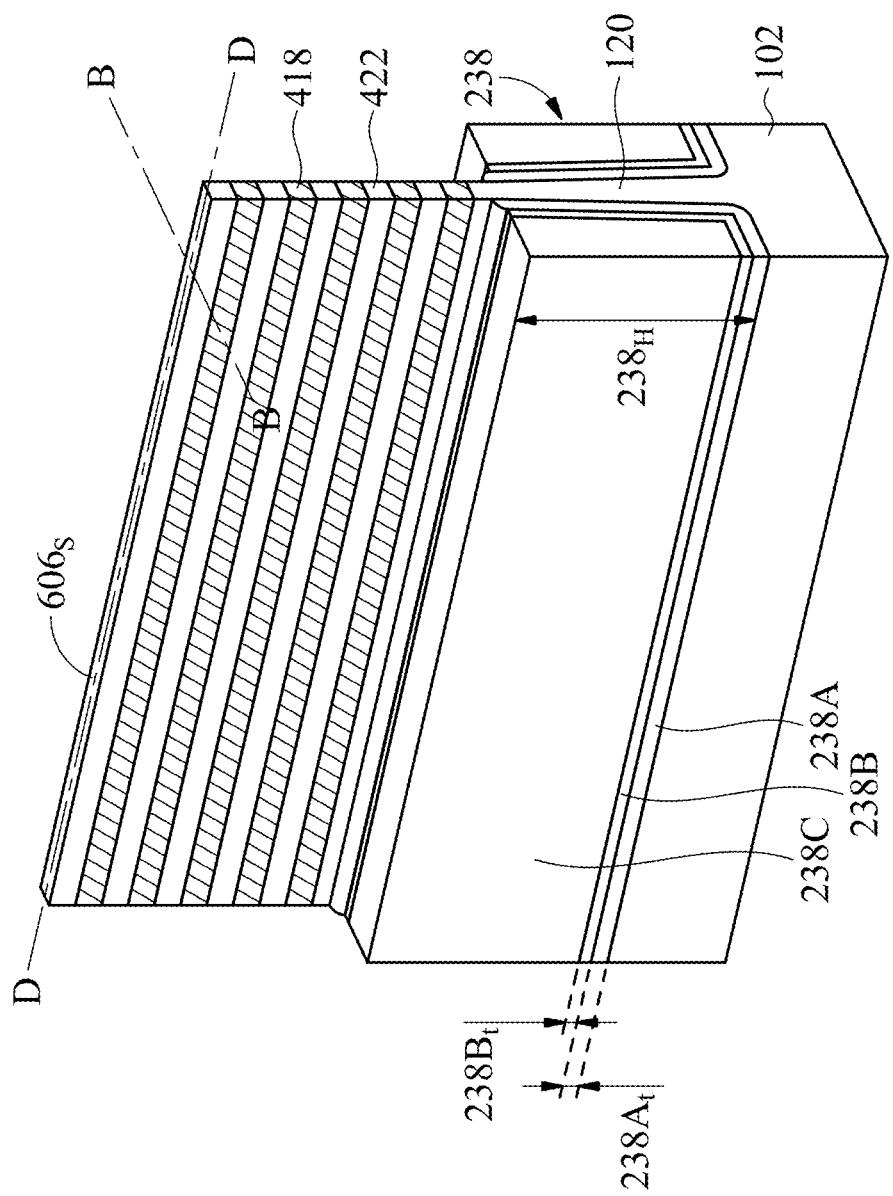
Figure 6C:
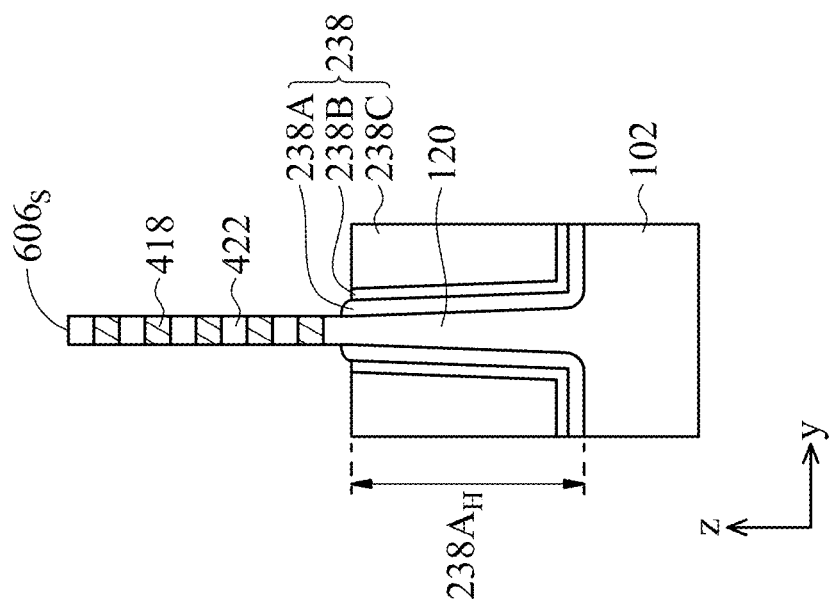
Figure 6B:
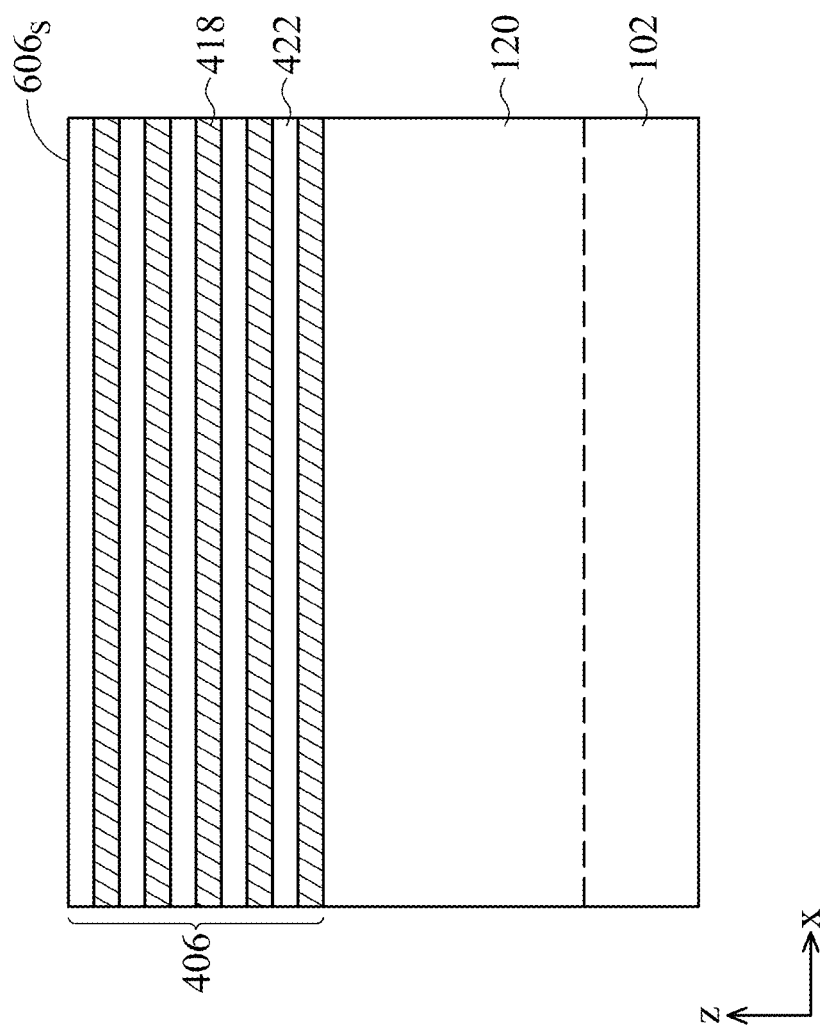

Further, in operation 305, STI regions can be formed on the substrate. For example, as shown in FIGS. 6A-6C, STI regions 238 with first and second protective liners 238A-238B and insulating layer 238C can be formed on substrate 102. The formation of STI regions 238 can include (i) depositing a layer of nitride material (not shown) for first protective liners 238A on the structure of FIG. 5A, (ii) depositing a layer of oxide material (not shown) for second protective liners 238B on the layer of nitride material, (iii) depositing a layer of insulating material for insulating layers 238C on the layer of oxide material, (iv) annealing the layer of insulating material for insulating layer 238C, (v) chemical mechanical polishing (CMP) the layers of nitride and oxide materials and the annealed layer of insulating material, and (vi) etching back the polished structure to form the structure of FIG. 6A.

The layers of nitride and oxide materials can be deposited using a suitable process for depositing oxide and nitride materials, such as ALD or CVD. These layers of oxide and nitride materials can prevent oxidation of the sidewalls of stacked fin portion 520 during the deposition and annealing of the insulating material for insulating layer 238C.

In some embodiments, the layer of insulating material for insulating layer 238C can include silicon oxide, silicon nitride, silicon oxynitride, FSG, or a low-k dielectric material. In some embodiments, the layer of insulating material can be deposited using a CVD process, a high-density-plasma (HDP) CVD process, using silane (SiH4) and oxygen ($O_2$) as reacting precursors. In some embodiments, layer of insulating material can be formed using a sub-atmospheric CVD (SACVD) process or HARP, where process gases can include tetraethoxysilane (TEOS) and/or ozone ($O_3$).

In some embodiments, the layer of insulating material can be formed by depositing flowable silicon oxide using a FCVD process. The FCVD process can be followed by a wet anneal process. The wet anneal process can include annealing the deposited layer of insulating material in steam at a temperature ranging from about 200° C. to about 700° C. for a period ranging from about 30 min to about 120 min. The wet anneal process can be followed by the CMP process to remove the patterned hard mask layers 540 and 542 and portions of the layers of nitride, oxide, and insulating materials for layers 238A-238C to substantially coplanarize top surfaces of the layers of nitride, oxide, and insulating materials with top surface 606s (FIGS. 6A-6C) of vertical structure 506. The CMP process can be followed by the etching process to etch back the layers of nitride, oxide, and insulating materials to form the structure of FIG. 6A.

The etch back of the layers of nitride, oxide, and insulating materials can be performed by a dry etch process, a wet etch process, or a combination thereof. In some embodiments, the dry etch process can include using a plasma dry etch with a gas mixture having octafluorocyclobutane ($C_4F_8$), argon (Ar), $O_2$, and helium (He), fluoroform ($CHF_3$) and He, carbon tetrafluoride ($CF_4$), difluoromethane ($CH_2F_2$), chlorine ($Cl_2$), and $O_2$, hydrogen bromide (HBr), $O_2$, and He, or a combination thereof with a pressure ranging from about 1 mTorr to about 5 mTorr. In some embodiments, the wet etch process can include using a DHF treatment, an ammonium peroxide mixture (APM), a sulfuric peroxide mixture (SPM), hot deionized water (DI water), or a combination thereof. In some embodiments, the wet etch process can include using ammonia ($NH_3$) and hydrofluoric acid (HF) as etchants and inert gases, such as Ar, xenon (Xe), He, or a combination thereof. In some embodiments, the flow rate of HF and $NH_3$ used in the wet etch process can each range from about 10 sccm to about 100 sccm (e.g., about 20 sccm, 30 sccm, or 40 sccm). In some embodiments, the wet etch process can be performed at a pressure ranging from about 5 mTorr to about 100 mTorr (e.g., about 20 mTorr, about 30 mTorr, or about 40 mTorr) and a high temperature ranging from about 50° C. to about 120° C.

In some embodiments, first and second protective liners 238A-238B can have respective thicknesses $238A_t$ and $238B_t$ ranging from about 1 nm to about 2 nm. In some embodiments, STI regions 238 can have a vertical dimension $238_H$ (e.g., height along the z-direction) ranging from about 40 nm to about 60 nm (e.g., about 45 nm, about 50 nm, or about 55 nm). In some embodiments, vertical dimension $238_H$ can be half of the total height $H_t$ of vertical structure 506. Other materials, formation methods, and dimensions for STI regions 238 are within the scope and spirit of this disclosure.

Figure 7A:
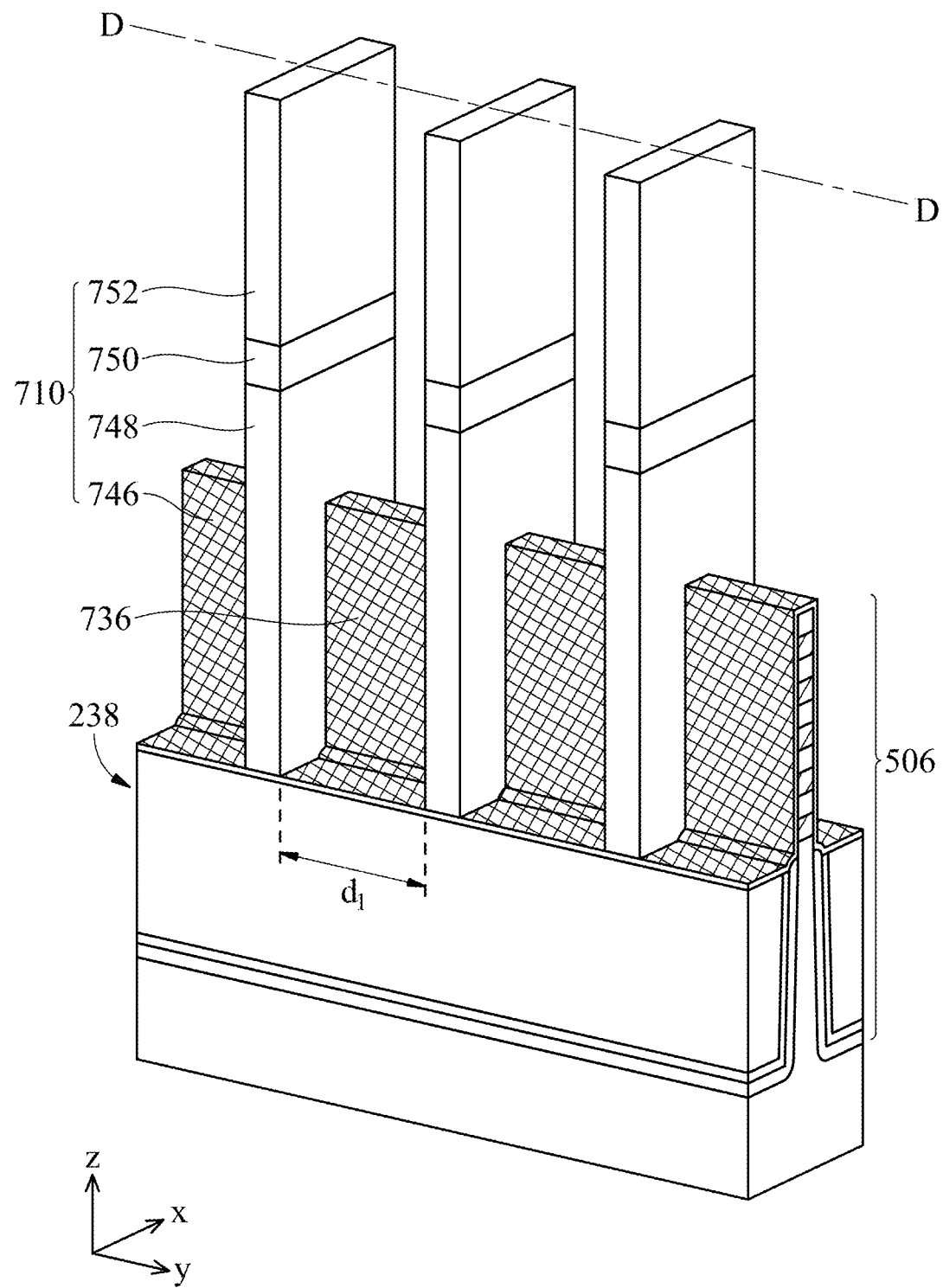
Figure 7B:
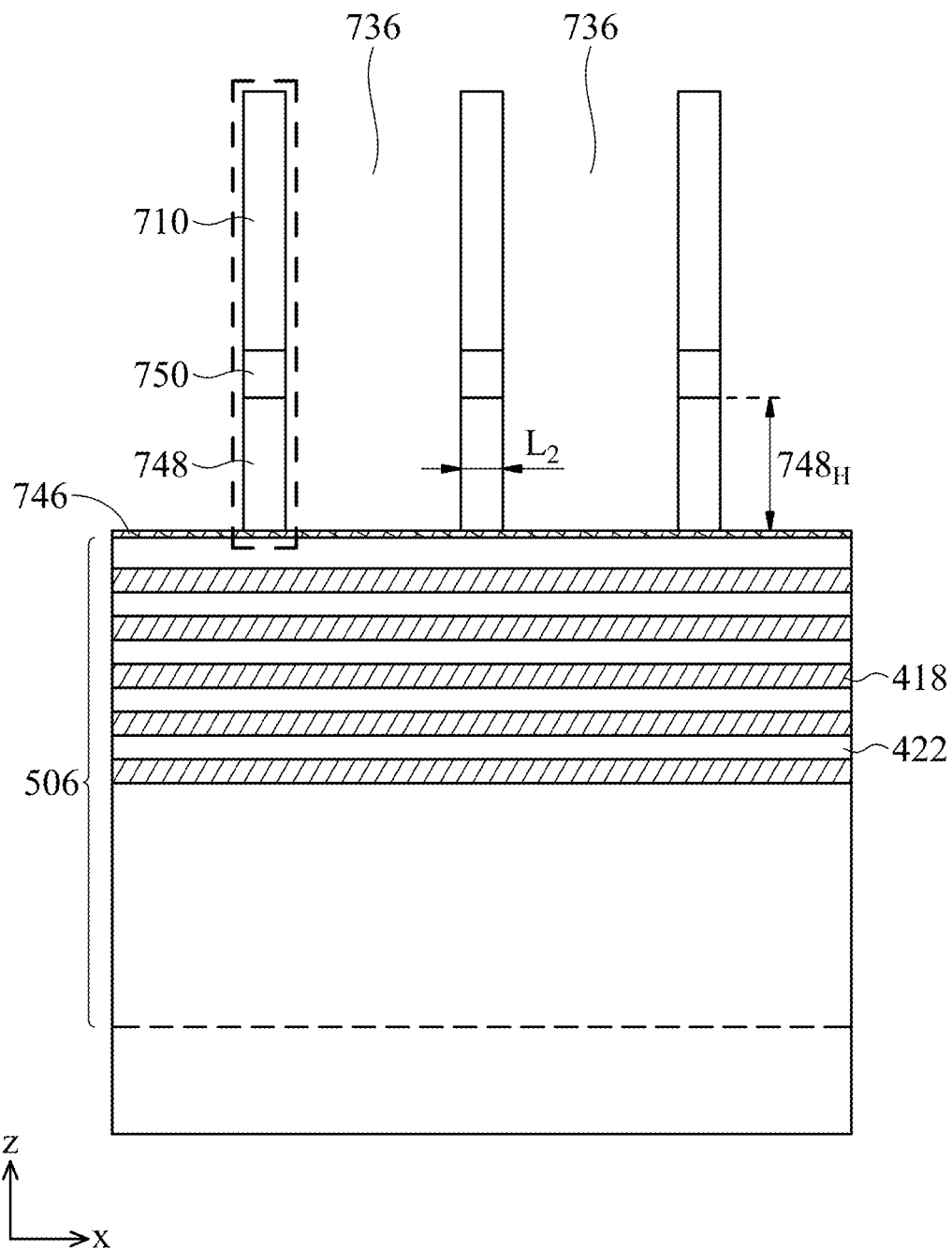

Referring to FIG. 3, in operation 310, one or more sacrificial gate structures are formed over the vertical structure. For example, as shown in FIGS. 7A and 7B, one or more sacrificial gate structures 710 can be formed over vertical structure 506. Sacrificial gate structure 710 can include a protective oxide layer 746 formed on vertical structure 506 and STI regions 238, a polysilicon structure 748 formed on protective oxide layer 746, a hard mask layer 750 formed over polysilicon structure 748, and a capping layer 752 formed over hard mask layer 750. The formation of protective oxide layer 746 can include blanket depositing a layer of oxide material on the structure of FIG. 6A followed by a high temperature anneal process. Protective oxide layer 746 can include a suitable oxide material, such as silicon oxide and can be blanket deposited using a suitable deposition process, such as CVD, ALD, plasma enhanced ALD (PEALD), PVD, or e-beam evaporation. In some embodiments, the layer of oxide material can be deposited using PEALD at an energy ranging from about 400 W to about 500 W and at a temperature ranging from about 300° C. to about 500° C. The deposition of the layer of oxide material can be followed by a dry anneal process under oxygen gas flow at a temperature ranging from about 800° C. to about 1050° C. The oxygen precursor concentration can range from about 0.5% to about 5% of the total gas flow rate. In some embodiments, the anneal process can be a flash process where the anneal time can be between about 0.5 s to about 5 s (e.g., about 1 s, about 2 s, about or about 5 s). In some embodiments, protective oxide layer 746 can have a thickness ranging from about 1 nm to about 3 nm. Other oxide materials, formation methods, and thicknesses for protective oxide layer 746 are within the scope and spirit of this disclosure. The presence of protective oxide layer 746 can protect vertical structure 506 during the formation of polysilicon structures 748.

The formation of protective oxide layer 746 can be followed by the formation of polysilicon structures 748 as shown in FIGS. 7A-7B. In some embodiments, the formation of polysilicon structures 748 can include blanket depositing a layer of polysilicon material on the deposited protective oxide layer 746 and etching the layer of polysilicon material through a patterned capping layer 752 and patterned hard mask layer 750 (shown in FIGS. 7A-7B) formed on the layer of polysilicon material. In some embodiments, polysilicon material can be undoped. In some embodiments, capping layer 752 and hard mask layer 750 can include an oxide layer and/or a nitride layer. The oxide layer can be formed using a thermal oxidation process and the nitride layer can be formed by LPCVD or PECVD. Capping layer 752 and hard mask layer 750 can protect polysilicon structures 748 from subsequent processing steps (e.g., forming gate spacers and inner spacers).

The blanket deposition of the layer of polysilicon material can include CVD, PVD, ALD, or other suitable deposition processes. In some embodiments, etching of the deposited layer of polysilicon material can include a dry etch, a wet etching, or a combination thereof. In some embodiments, etching of the deposited layer of polysilicon material to form polysilicon structures 748 can include four etching steps. The first polysilicon etch step can include using a gas mixture having HBr, $O_2$, $CHF_3$, and $Cl_2$. The second polysilicon etch step can include using a gas mixture having HBr, $O_2$, $Cl_2$, and nitrogen ($N_2$) at a pressure of about 45 mTorr to about 60 mTorr. The third polysilicon etch step can include using a gas mixture having HBr, $O_2$, $Cl_2$, $N_2$, and Ar at a pressure of about 45 mTorr to about 60 mTorr. The fourth polysilicon etch step can include using a gas mixture having HBr, $O_2$, $Cl_2$, and $N_2$ at a pressure of about 45 mTorr to about 60 mTorr. The first polysilicon etch step can have a higher polysilicon etch rate than the second, third, and/or fourth polysilicon etch steps. The first polysilicon etch step is used to etch unwanted portions of the blanket deposited layer of polysilicon material above vertical structure 506. The second, third, and fourth polysilicon etch steps are used to etch unwanted portions of the blanket deposited layer of polysilicon material within high aspect ratio (e.g., greater than 5.0) spaces 736.

In some embodiments, vertical dimensions $748_H$ of polysilicon structures 748 (e.g., along the z-direction) can range from about 100 nm to about 150 nm. In some embodiments, horizontal dimensions $L_2$ of polysilicon structures 748 (e.g., along the x-direction) can range from about 3 nm to about 100 nm. In some embodiments, horizontal dimensions $L_2$ can be substantially identical to gate structure 210's gate length of the resulting device 200 (shown in FIG. 2A). Polysilicon structures 748 can have a high aspect ratio equal to or greater than about 9, where aspect ratio is a ratio of dimension $748_H$ to dimension $L_2$. In some embodiments, horizontal dimensions $d_1$ (e.g., spacing along the x-direction) between adjacent polysilicon structures 748 can range from about 40 nm to about 90 nm.

Figure 8:
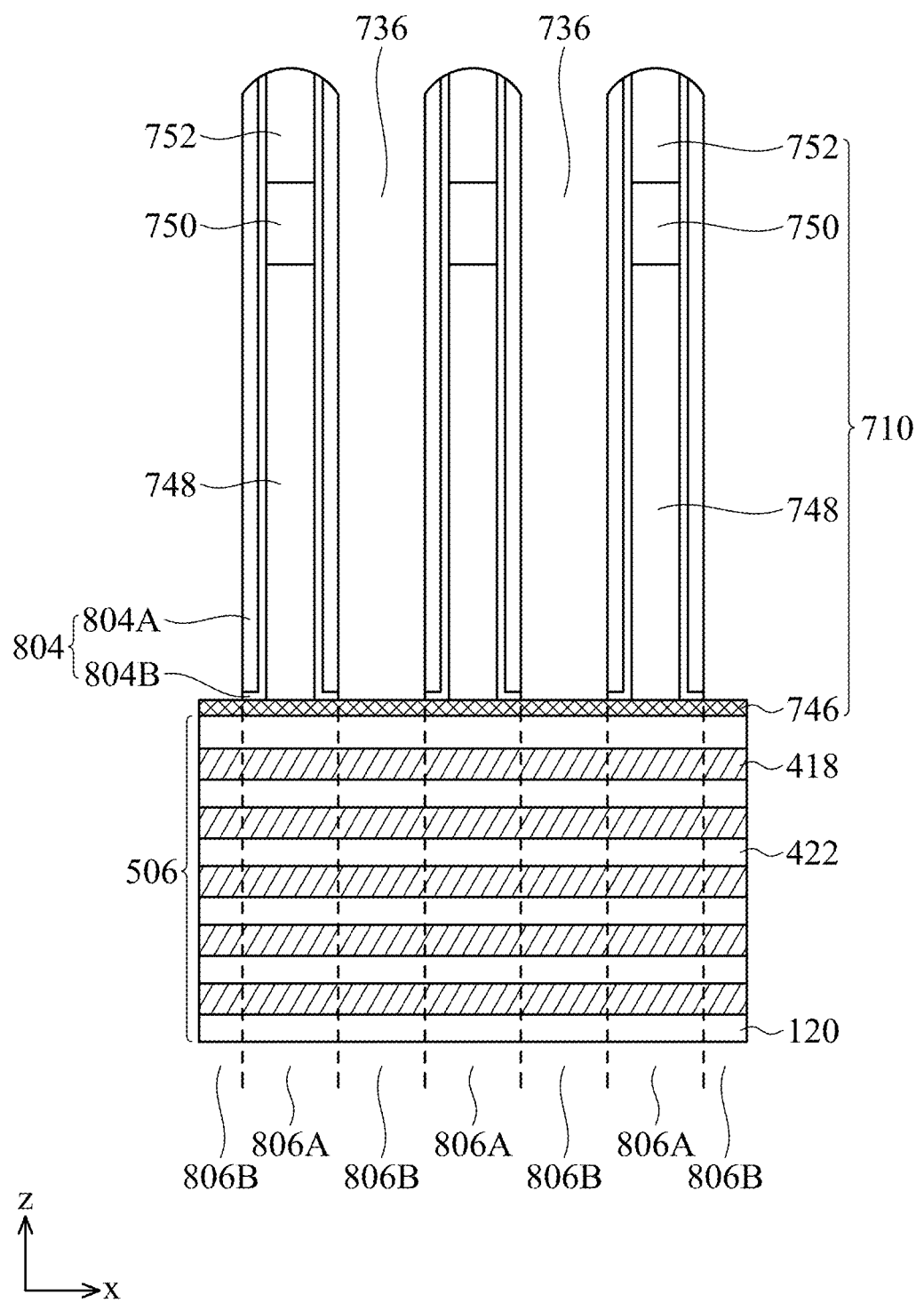

Further, in operation 310, gate spacers are formed on sidewalls of the polysilicon structures. For example, as shown in FIG. 8, gate spacers 804 (e.g., gate spacers 804A and 804B) can be formed on sidewalls of polysilicon structures 748. The formation of gate spacers 804 can include blanket depositing one or more layers of insulating material (e.g., an oxide or a nitride material) on the structure of FIG. 7A by a CVD, a PVD, or an ALD process followed by photolithography and an etching process (e.g., reactive ion etching or other dry etching process using a chlorine or fluorine based etchant). In some embodiments, the insulating material of each gate spacer layer (e.g., spacer 804A and 804B) of gate spacer 804 can be same or different from each other. In some embodiments, each of gate spacers 804A and 804B can have a thickness ranging from about 2 nm to about 5 nm. As shown in FIG. 8, after forming gate spacers 804, vertical structure 506's portions 806B (e.g., under space 736) can be exposed, while vertical structure 506's portions 806A can be covered by sacrificial gate structure 710 and gate spacers 804.

Figure 9:
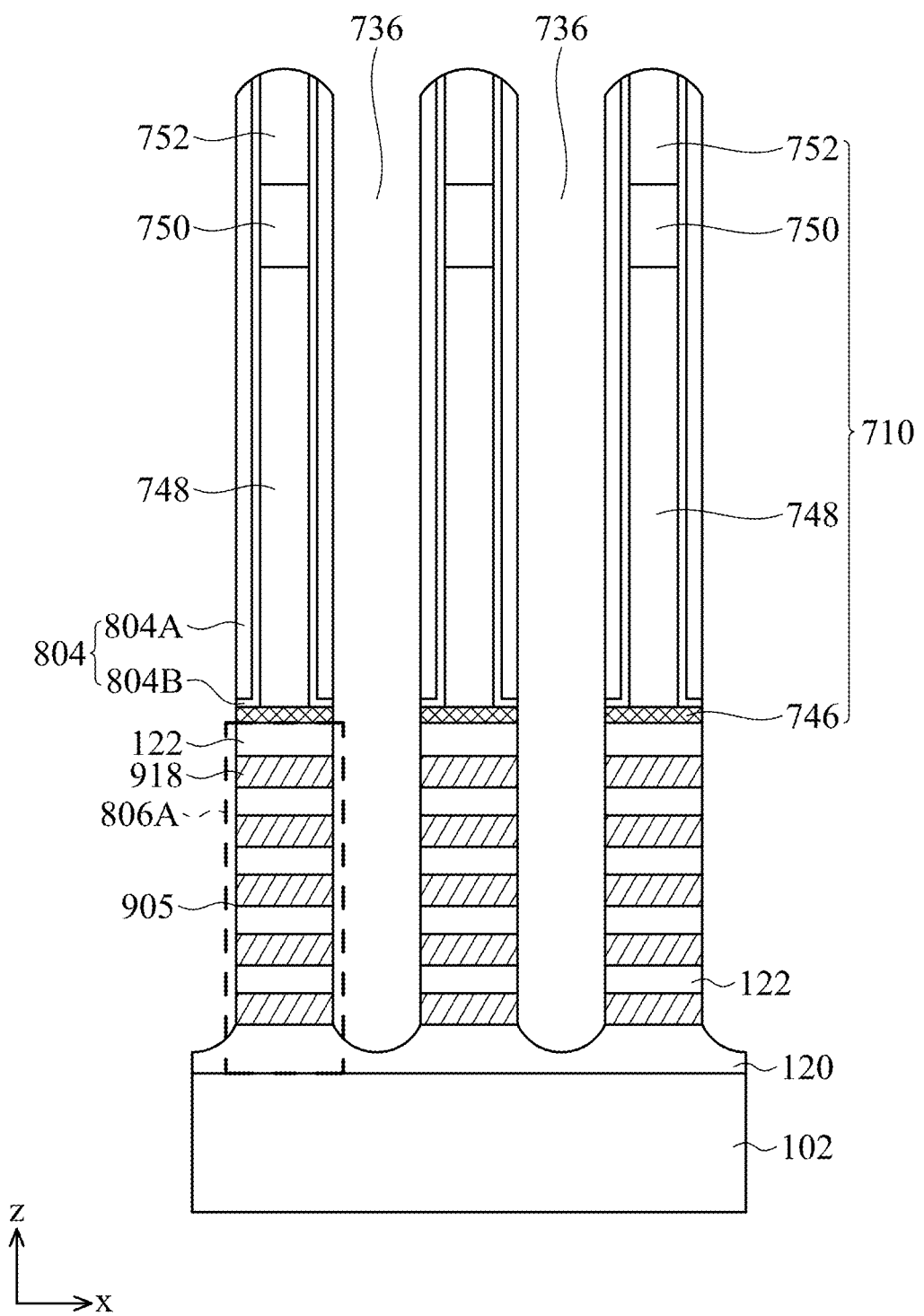

Referring to FIG. 3, in operation 315, a first portion of the vertical structure is removed to expose a second portion of the vertical structure. For example, as shown in FIGS. 8 and 9, vertical structure 506's portions 806B can be removed to expose sidewalls 905 of vertical structure 506's portions 806A, where sidewalls 905 can face space 736. In some embodiments, sidewall 905 can include sidewalls of channel layers 122 (shown in FIG. 9) residing in portion 806A. In some embodiments, sidewall 905 can also include sidewalls of semiconductor layers 918 (shown in FIG. 9) residing in portion 806A. First semiconductor layer 418, second semiconductor layer 422, and a portion of base region 120 within vertical structure 506's portions 806B can be removed via an etching back process using sacrificial gate structure 710 and gate spacers 804 as hard masks. The etching back process can also remove portions of protective oxide layer 746 outside sacrificial gate structures 710. As shown in FIG. 9, after the etching back process, vertical structure 506's portions 806A protected by sacrificial gate structure 710 and gate spacers 804 can include channel layers 122 and semiconductor layers 918. In some embodiments, the etching back process can be an etching process, such as a dry etch process, a wet etch process, or a combination thereof. In some embodiments, the dry etch process can use reactive ion etching using a chlorine or fluorine based etchant. In some embodiments, the etching back process can have a negligible etching rate on gate spacers 804 and/or STI region 238 (not shown in FIG. 8).

Referring to FIG. 3, in operation 320, multiple inner spacers are formed over the second portion of the vertical structure. For example, as shown in FIG. 13, multiple inner spacers 1308 can be formed on vertical structure 506's portions 806A. In some embodiments, inner spacer 1308 can be formed over an exposed portion of vertical structure 506's portions 806A, such as sidewalls 905 (shown in FIG. 9). FIGS. 10-13 are cross-sectional views of partially fabricated structures that can be used to describe the fabrication stages of operation 320. The process of forming multiple inner spacers 1308 can include forming multiple recess structures 1003 (shown in FIG. 10), forming a blanket film 1112 in recess structures 1003 to form recess structures 1103 (shown in FIG. 11), forming a sacrificial film 1214 over blanket film 1112 (shown in FIG. 12), and removing blanket film 1112 and sacrificial film 1214 outside sacrificial gate structures 710 (shown in FIG. 13).

Figure 10:
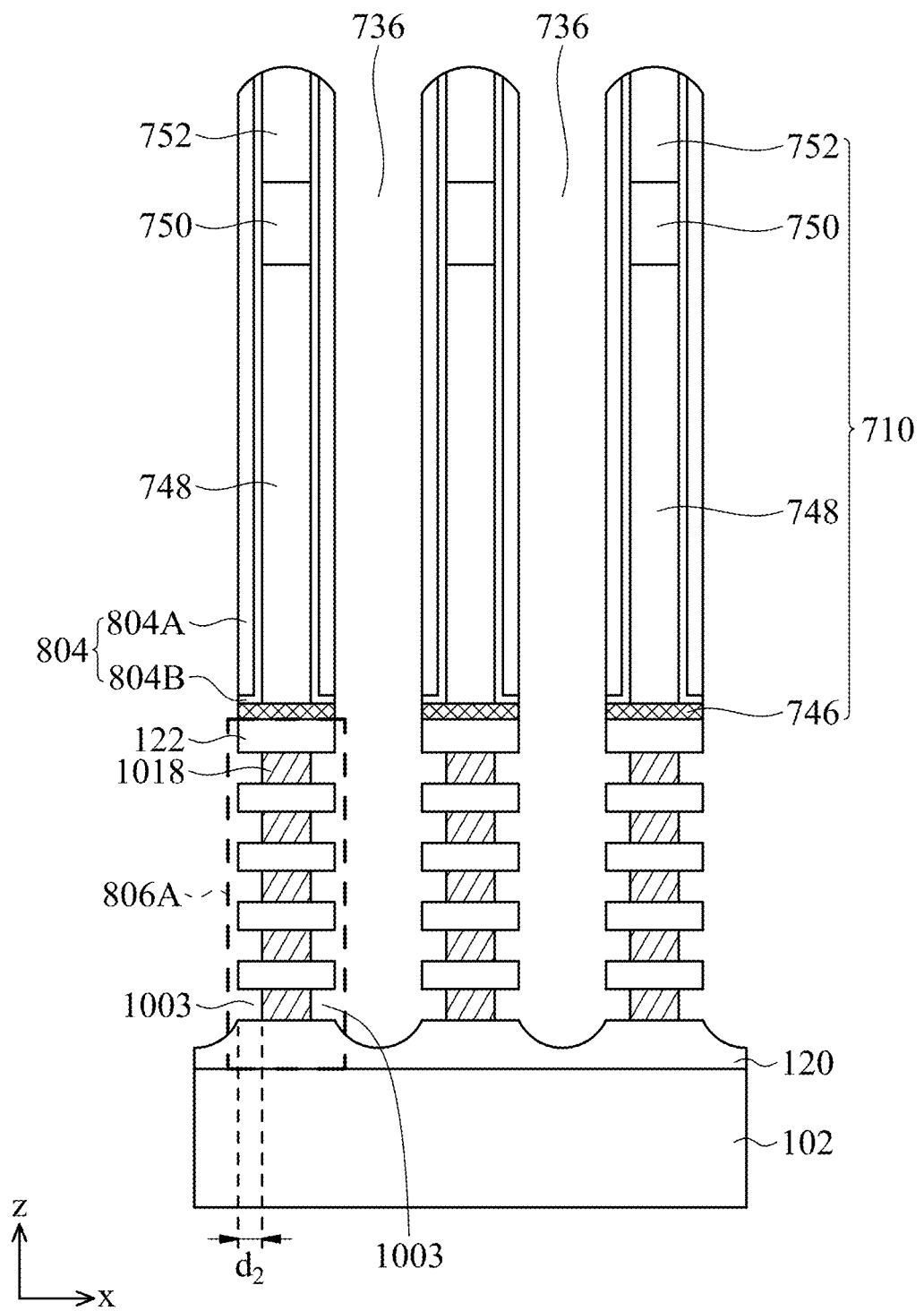

In referring to FIG. 10, multiple recess structures 1003 can be formed in vertical structure 506's portions 806A. The process of forming recess structures 1003 can include recessing a portion of semiconductor layers 918 in portions 806A to form semiconductor layers 1018 via a selective etching process. By way of example and not limitation, channel layers 122 can be Si layers and semiconductor layer 918 (shown in FIG. 9) can be a SiGe layers, where the selective etching process can be a drying etching process selective towards SiGe. In some embodiments. the dry etching process can include applying an etchant containing halogen-based gases, a mixture of gases of HF/$F_2$, or a mixture of $NF_3$ and hydrogen radical (H*). For example, halogen-based chemistries can exhibit etch selectivity that is higher for Ge and lower for Si. Therefore, halogen gases can etch Ge faster than Si. Further, halogen gases can etch SiGe faster than Si. Thus, the selective etching process can be designed not to remove channel layers 122 after forming recess structures 1003. In some embodiments, the halogen-based chemistries can include fluorine-based and/or chlorine-based gasses. Alternatively, a wet etch chemistry with high selectivity towards SiGe can be used. By way of example and not limitation, a wet etch chemistry can include a mixture of sulfuric acid ($H_2SO_4$) and hydrogen peroxide ($H_2O_2$) (SPM), or a mixture of ammonia hydroxide with $H_2O_2$ and water (APM). In some embodiments, recess structure 1003 can have a depth $d_2$ ranging between about 3 nm to about 10 nm (e.g., 5 nm) or about 5 nm to about 8 nm (e.g., 7 nm).

In some embodiments, the selective etching process for forming recess structures 1003 can be performed under a pressure of about 1 mTorr to about 4 Torr (e.g., 50 mTorr), a power of about 50 W to about 1000 W (e.g., about 100 W), a bias voltage of about 0 V to about 500 V (e.g., about 100 V), at a temperature of about −30° C. to about 180° C. (e.g., about 60° C.), and using HBr and/or $Cl_2$ as etch gases. During the etching process, polysilicon structures 748 can be protected from being etched by capping layer 752, hard mask layer 750 and gate spacers 840. In some embodiments, an etching process having the pressure, power, voltage, and temperature below the above noted range may not form suitable plasma species to selectively recessing semiconductor layer 918 from channel layers 122. In some embodiments, an etching process having the pressure, power, voltage, and temperature beyond the above noted range may unselectively etch both semiconductor layer 918 and channel layers 122, thus not suitable for forming recess structures 1003.

In referring to FIG. 11, a blanket film 1112 can be formed in recess structures 1003 to form recess structures 1103. The process of forming blanket film 1112 can include depositing an insulating material conformally over sacrificial gate structures 710 and in recess structures 1003 to form recess structures 1103 using CVD or ALD. The insulating material can include silicon oxide, silicon nitride, amorphous silicon, or a low-k material. In some embodiments, blanket film 1112 can have a thickness ranging between about 1 nm to about 5 nm (e.g., about 3 nm) or about 1 nm to about 3 nm (e.g., about 5 nm). In some embodiments, blanket film 1112 can include recess structures 1103.

Figure 12:
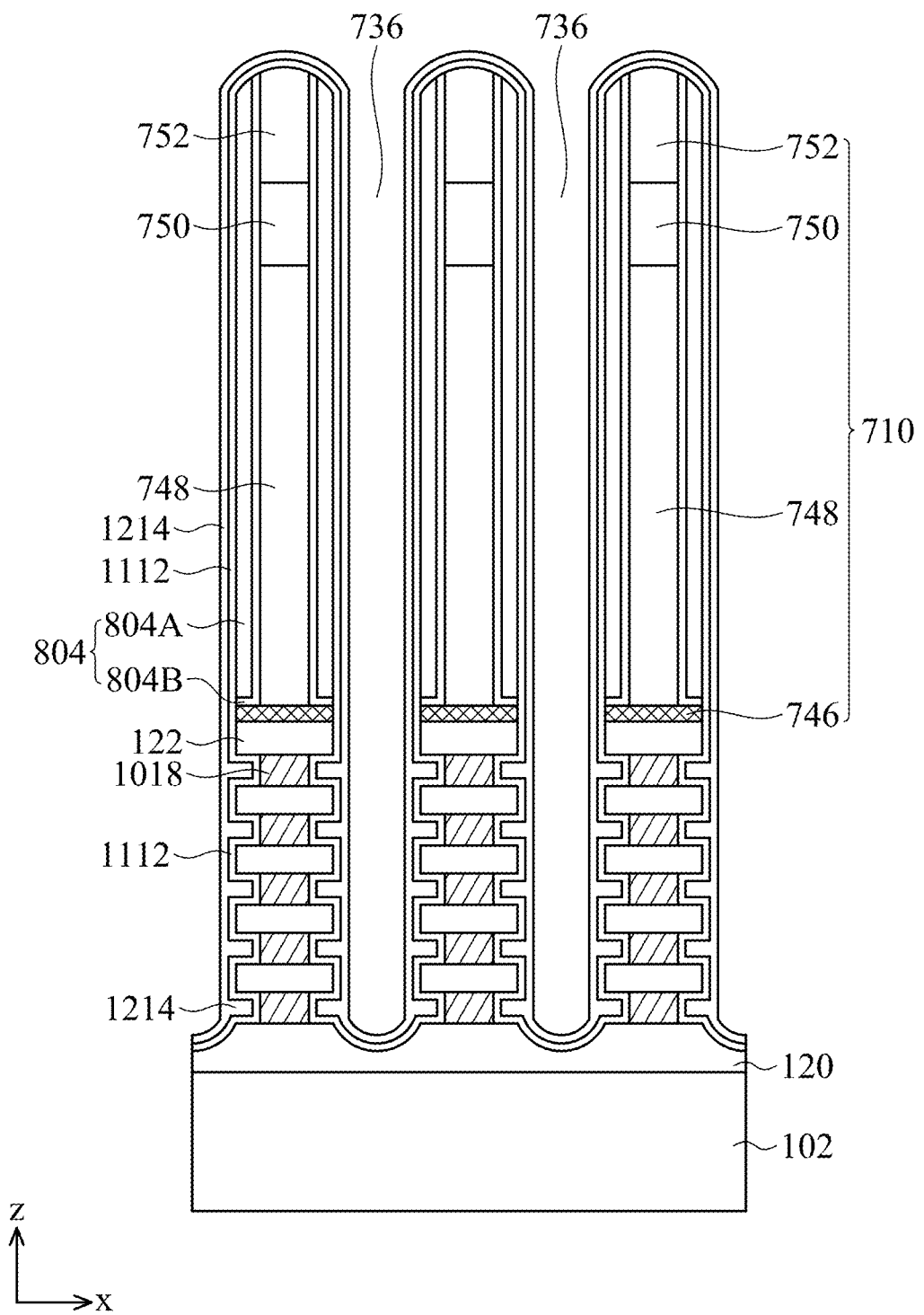
Figure 13:
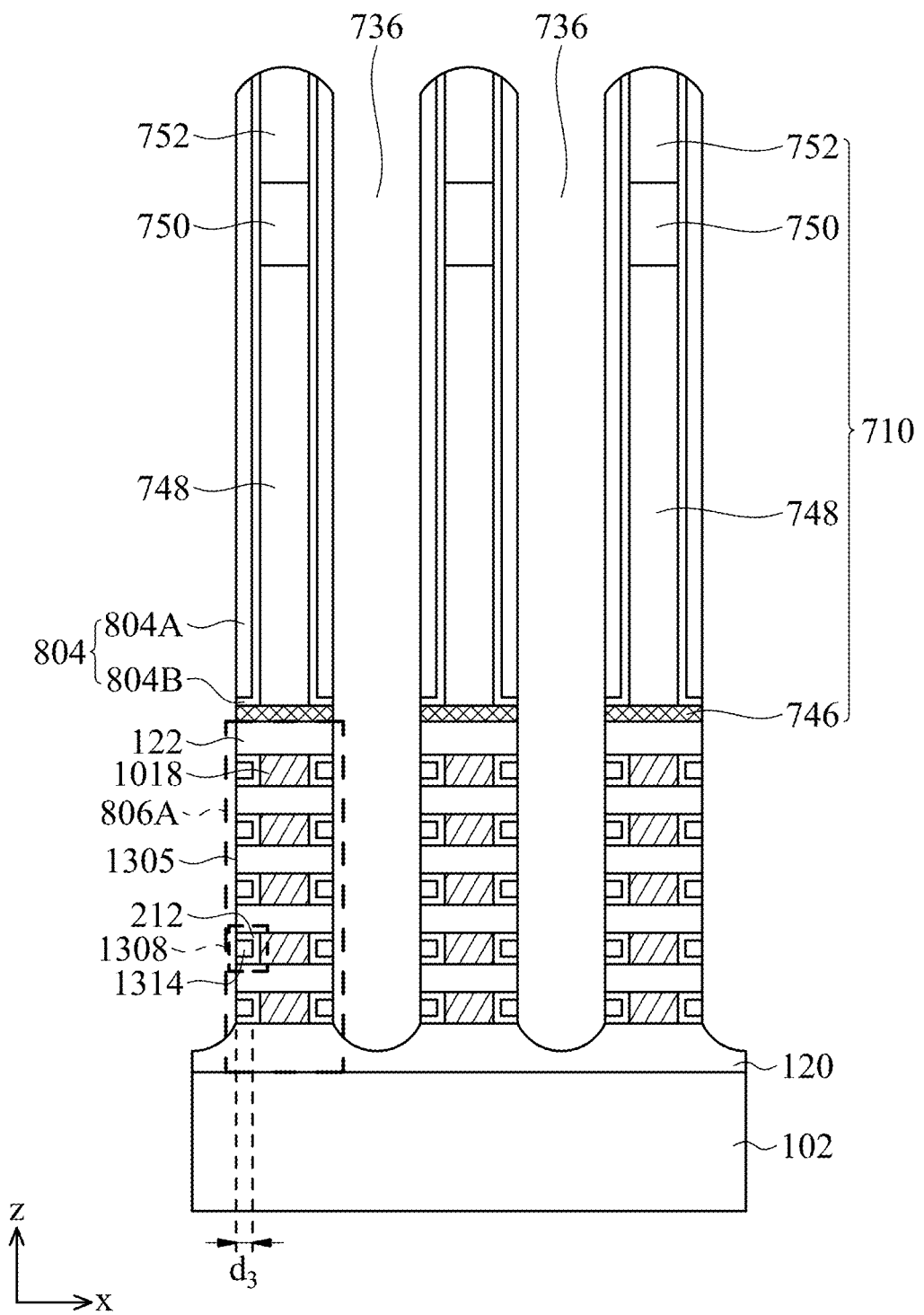

In referring to FIG. 12, the process of forming sacrificial film 1214 can include depositing a silicon-germanium material over the structure of FIG. 11 by a CVD, a PVD, or an ALD process. In some embodiments, the deposition of sacrificial film 1214 can include filling the silicon-germanium material in recess structures 1103. The silicon-germanium material for sacrificial film 1214 can have an atomic composition of germanium range from about 10% to about 80% or about 20% to 70% (e.g., about 40% or 60%). In some embodiments, sacrificial film 1214 can have a thickness ranging from about 1 nm to about 10 nm or from about 2 nm to about 5 nm (e.g., about 3 nm).

In referring to FIG. 13, blanket film 1112 and sacrificial film 1214 outside sacrificial gate structures 710 and gate spacers 804 can be removed to respectively form dielectric layer 212 and sacrificial layer 1314. The processes for removing blanket film 1112 and sacrificial film 1214 can include using a dry etch process, a wet etch process, or a combination thereof. In some embodiments, the process for removing blanket film 1112 and sacrificial film 1214 can expose channel layers 212's sidewalls 1305 (e.g., an embodiment of sidewall 905) that face spaces 736. In some embodiments, dielectric layer 212 and sacrificial layer 1314 can be positioned under sacrificial gate structure 710. In some embodiments, sacrificial layer 1314 can have a thickness $d_3$ (e.g., along the x-direction) ranging from about 2 nm to about 5 nm (e.g., about 3 nm).

In some embodiments, the process of forming multiple inner spacers 1308 (e.g., operation 320) can include forming multiple recess structures 1003, forming sacrificial film 1214 in recess structure 1003 using CVD or ALD, and removing sacrificial film 1214 outside sacrificial gate structures 710 and gate spacers 804.

Figure 14:
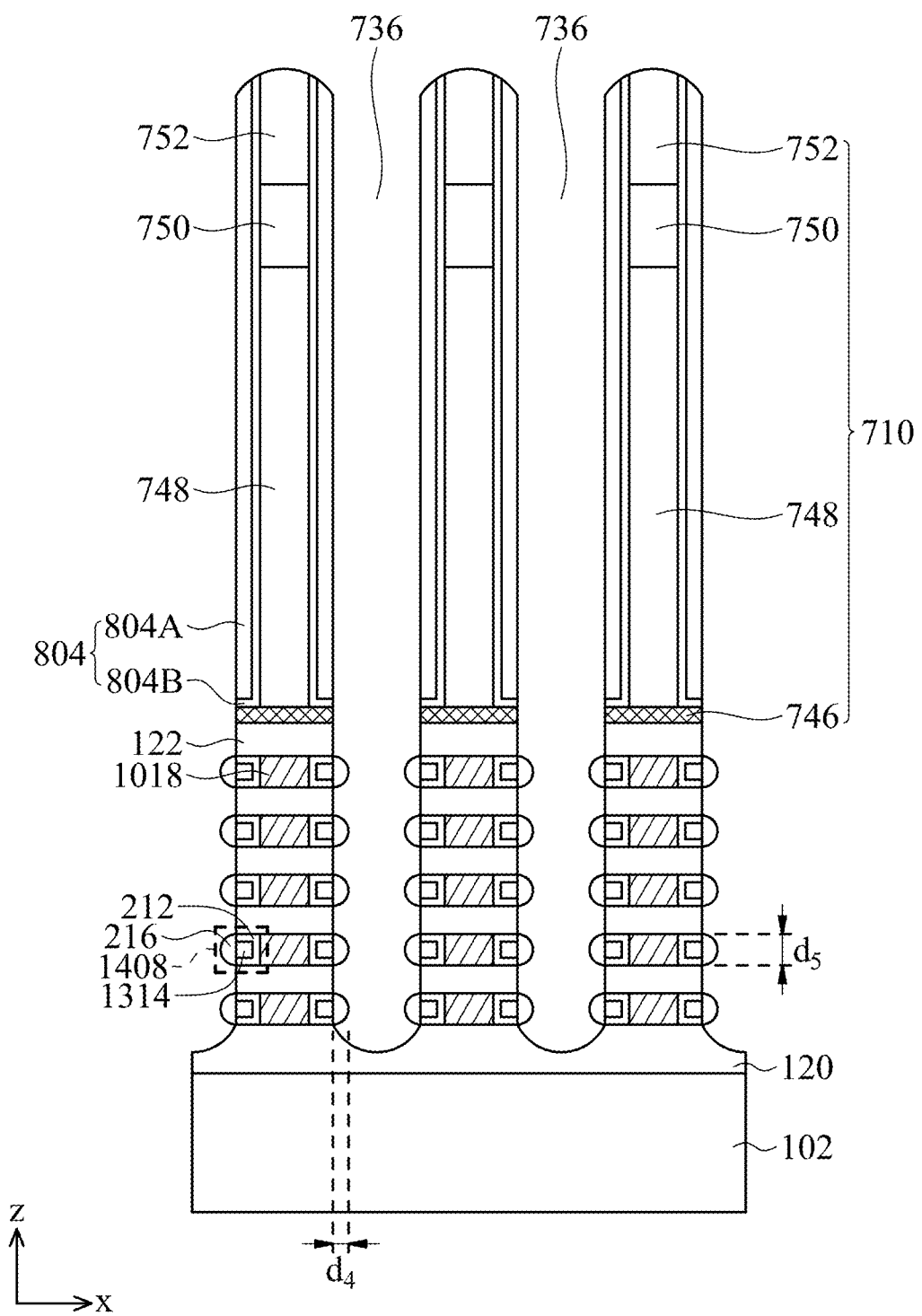
Figure 15:
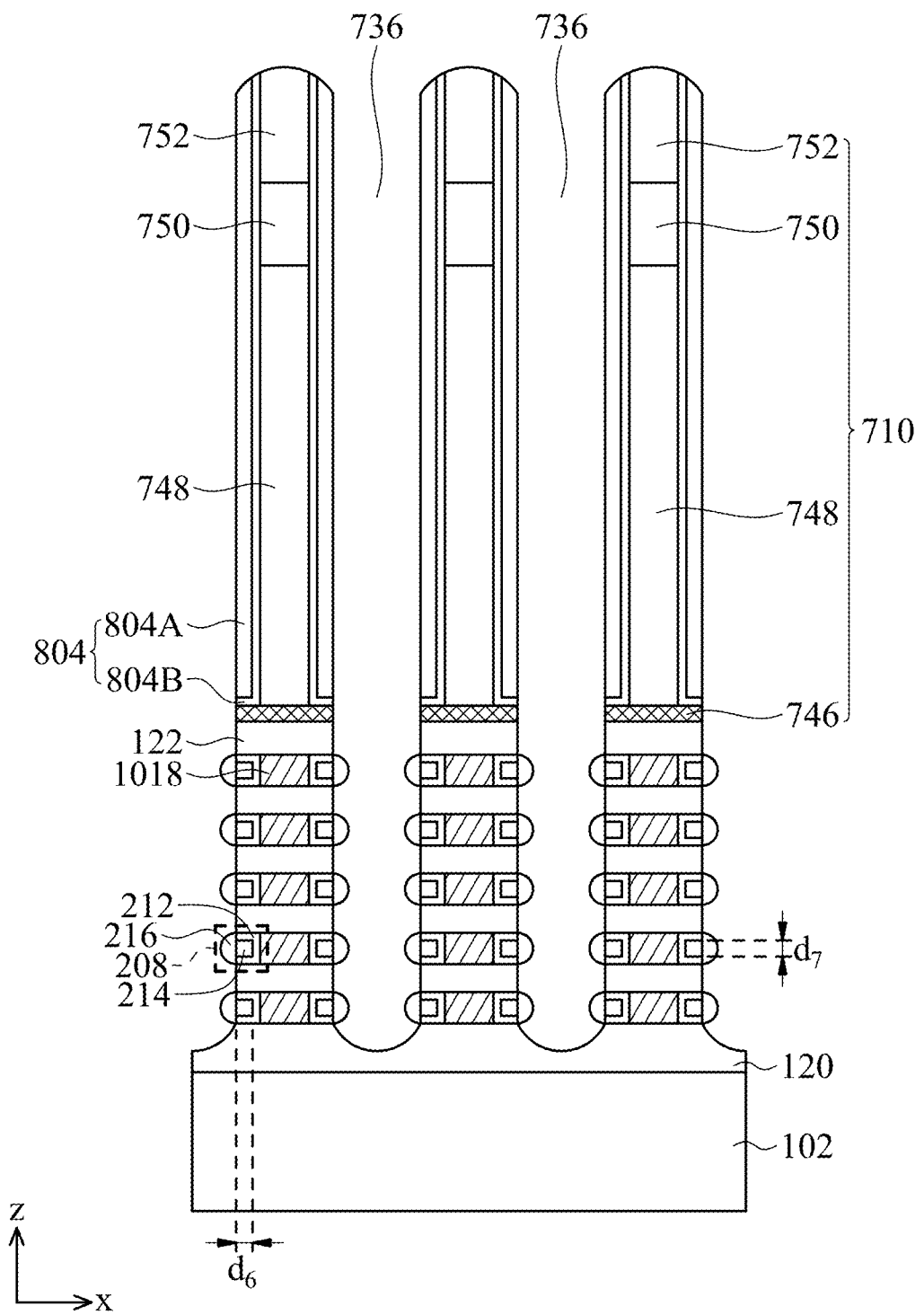

Referring to FIG. 3, in operation 325, a void structure is formed in each of the inner spacers. For example, as shown in FIG. 15, void structure 214 can be formed in each inner spacer 208. FIGS. 14 and 15 are cross-sectional views of partially fabricated structures that can be used to describe the fabrication stages of operation 325. The process of forming void structure 214 can include forming inner spacer 1408 (shown in FIG. 14), and selectively removing inner spacer 1408's inner portion from inner spacer 1408's outer portion (shown in FIG. 15).

In referring to FIG. 14, inner spacer 1408 can include annealing inner spacer 1308 to oxidize a portion of sacrificial layer 1314 (shown in FIG. 13) adjacent to spaces 736 using an annealing process. The annealing process can be performed in a steam and/or oxygen at a temperature ranging from about 300° C. to about 1000° C. for a period ranging from about 30 minutes to about 6 hours. As a result, dielectric layer 216 (e.g., an oxide associated with sacrificial layer 1314) can be formed at inner spacer 1408's surface (e.g., facing space 736) to encapsulate portions of sacrificial layer 1314 that are not oxidized by the annealing process. In some embodiments, sacrificial layer 1314 can be a silicon-germanium compound, and therefore the respective resulting dielectric layer 216 can be a silicon-germanium oxide after the annealing process. In some embodiments, dielectric layer 216 can encapsulate dielectric layer 212. In some embodiments, dielectric layer 216 can separate sacrificial layer 1314 and/or dielectric layer 212 from space 736. In some embodiments, dielectric layer 216 can be formed away from a sacrificial gate structure 710, and sacrificial layer 1314 can be formed adjacent to the sacrificial gate structure 710. For example, dielectric layer 216 can be formed horizontally (e.g., in the x-direction) outside sacrificial gate structure 710, and sacrificial layer 1314 can be formed horizontally (e.g., in the x-direction) under sacrificial gate structure 710. In some embodiments, a portion of dielectric layer 216 can extend into space 736 (e.g., horizontally (e.g., in the x-direction) outside sacrificial gate structure 710), while another portion of dielectric layer 216 can be under sacrificial gate structure 710. In some embodiments, by comparing FIGS. 11 and 14, dielectric layer 216 can seal an opening of recess structure 1103. In some embodiments, by comparing FIGS. 9 and 14, inner spacer 1408 can seal an opening of recess structure 1003. In some embodiments, dielectric layer 216 can have a horizontal (e.g., along the x-direction) dimension $d_4$ ranging from about 5 nm to about 10 nm (e.g., about 7 nm), and a vertical (e.g., along the z-direction) dimension $d_5$ ranging from about 5 nm to about 10 nm (e.g., about 7 nm).

In referring to FIG. 15, inner spacer 1408's inner portion (e.g., sacrificial layer 1314 shown in FIG. 14) can be selectively removed from inner spacer 1408's outer portion (e.g., dielectric layer 216 shown in FIG. 14) using an etching process, where inner spacer 1408's inner portion can be embedded/encapsulated by inner spacer 1408's outer portion. The etching process can include a dry etching process, a wet etching process, or a combination thereof. The etching process can selectively remove sacrificial layer 1314 from dielectric layers 212 and 216. In some embodiments, the etching process can remove sacrificial layer 1314 using a HCl gas at a temperature ranging from about 400° C. to about 800° C. for a period ranging from about 15 seconds to about 300 seconds. In some embodiments, void structure 214 can have a horizontal (e.g., along the x-direction) dimension $d_6$ ranging from about 1 nm to about 10 nm (e.g., about 3 nm or 5 nm), and a vertical (e.g., along the z-direction) dimension $d_7$ ranging from about 1 nm to about 10 nm (e.g., about 3 nm or 5 nm).

Figure 16:
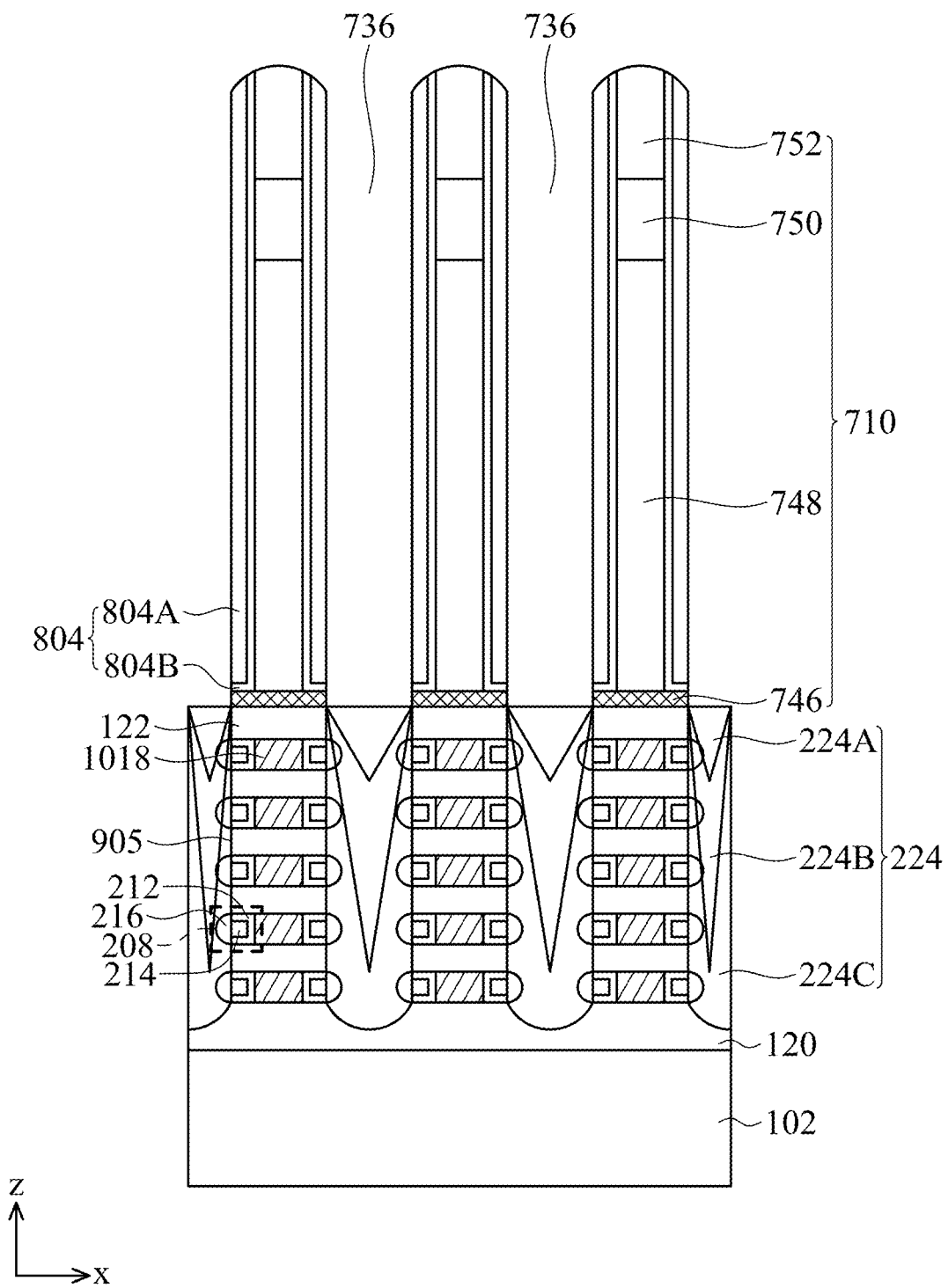

Referring to FIG. 3, in operation 330, multiple epitaxial regions are formed over the inner spacers. For example, as shown in FIG. 16, source-drain regions 224 (e.g., sub-regions 224A-224C) can be formed over inner spacers 208. Source-drain region 224 can be formed on surfaces of structure in FIG. 15 not covered by sacrificial gate structures 710. In some embodiments, source-drain region 224 can be formed over and outside inner spacer 208's void structure 214. In some embodiments, source-drain region 224 can be formed over inner spacers 208, while void structure 214 can be encapsulated by dielectric layers 212 and 216. In some embodiments, source-drain region 224 can be formed over and in contact with channel layer 122's sidewall 905. The process of forming source-drain region 224 can include an epitaxial growth process grown by (i) CVD, such as LPCVD, ALCVD, UHVCVD, RPCVD, or any suitable CVD; (ii) MBE processes; (iii) any suitable epitaxial process; or (iv) a combination thereof. In some embodiments, source-drain region 224 can be grown by an epitaxial deposition/partial etch process, which repeats the epitaxial deposition/partial etch process at least once. In some embodiments, source-drain regions 224 can be grown by selective epitaxial growth (SEG), where an etching gas is added to promote the selective growth of semiconductor material on the exposed surfaces of channel layers 122, but not on insulating material (e.g., insulating material of STI regions 238 and/or gate spacers 804).

In some embodiments, source-drain region 224 can be p-type or n-type. In some embodiments, p-type source-drain region 224 can include SiGe and can be in-situ doped during the epitaxial growth process using p-type dopants, such as boron, indium, and gallium. For p-type in-situ doping, p-type doping precursors such as, but not limited to, $B_2H_6$, $BF_3$, and/or other p-type doping precursors can be used. In some embodiments, n-type source-drain region 224 can include Si without any substantial amount of Ge and can be in-situ doped during the epitaxial growth process using n-type dopants, such as phosphorus or arsenic. For n-type in-situ doping, n-type doping precursors such as, but not limited to, $PH_3$, $AsH_3$, and/or other n-type doping precursor can be used.

Figure 17:
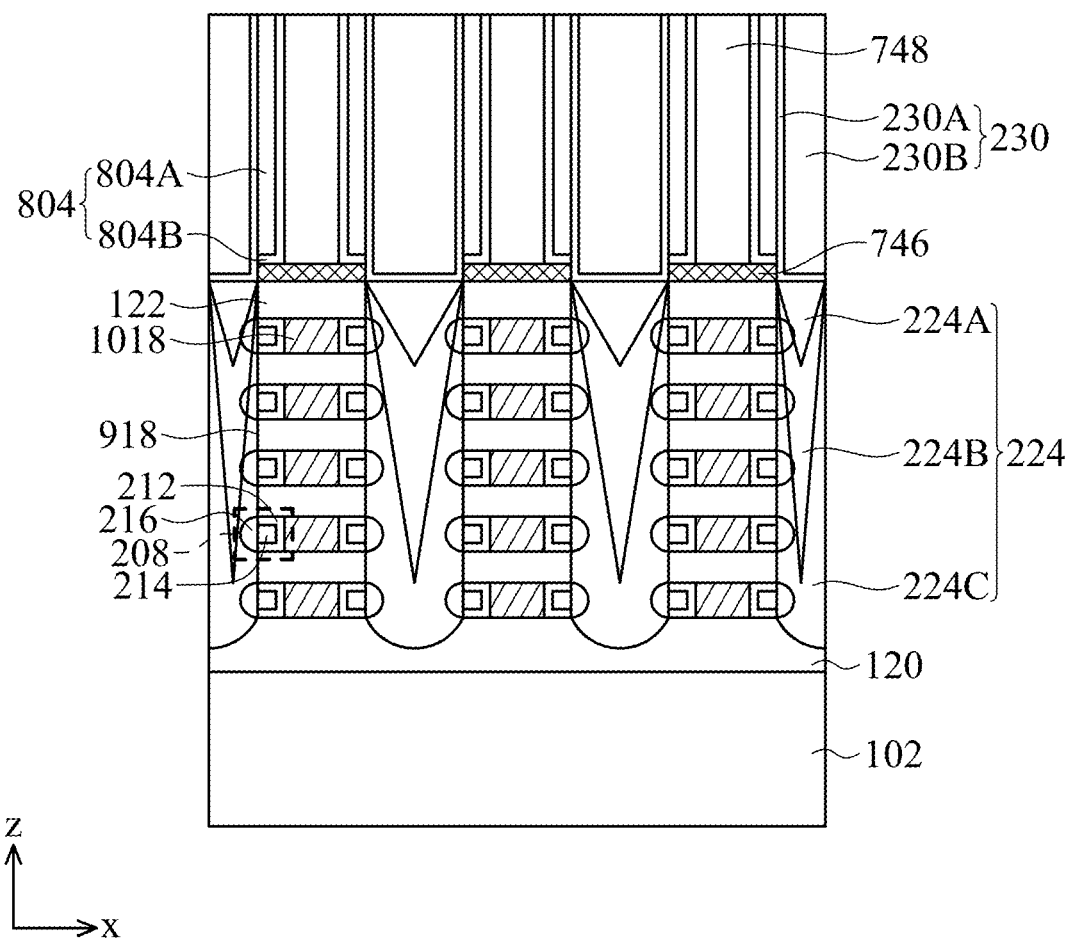
Figure 18:
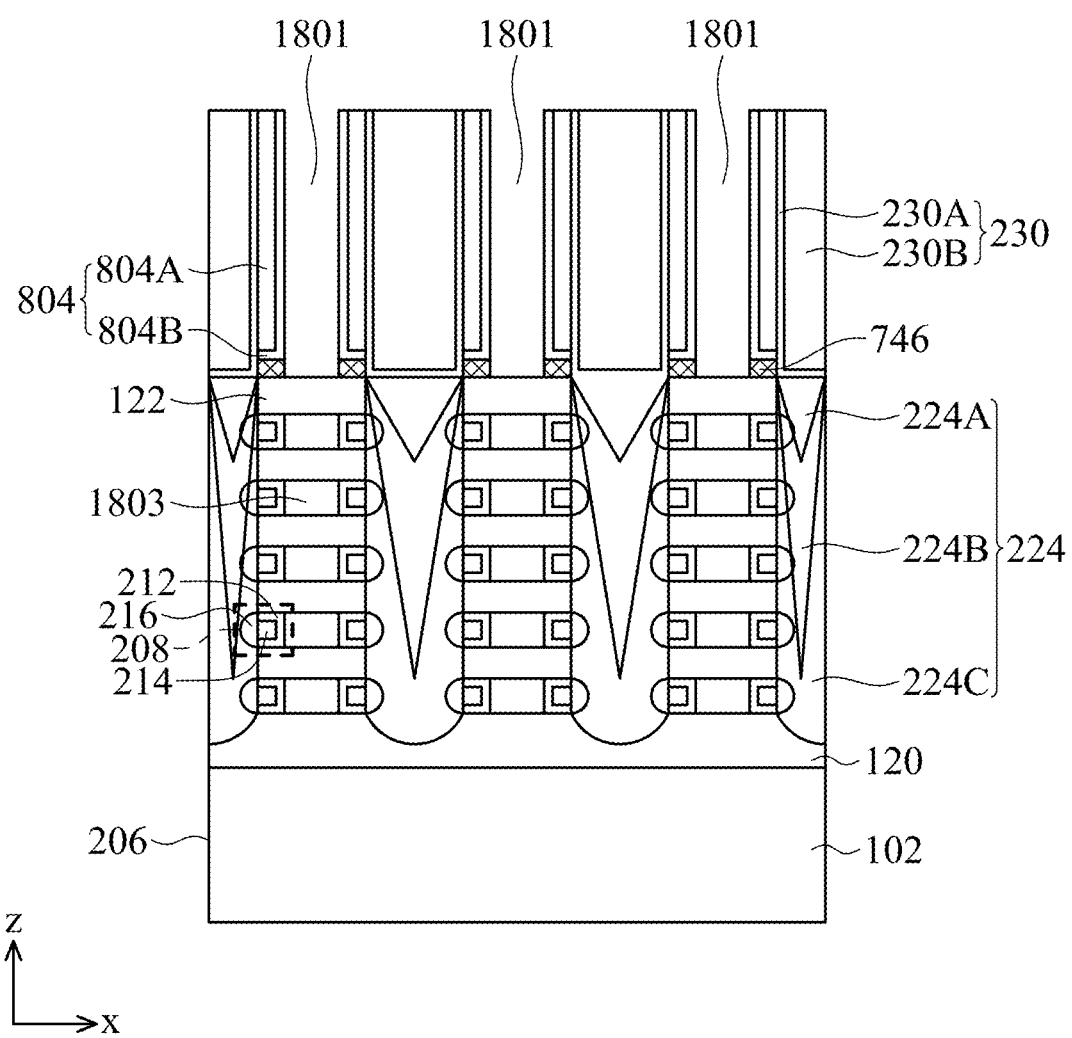

Referring to FIG. 3, in operation 335, sacrificial gate structures are replaced with metal gate structures. For example, gate structures 210 can be formed wrapped around each channel layers in channel region 122 (e.g., channel layers 122) of vertical structure 206 as described with reference to FIGS. 2A and 2B. FIGS. 17 and 18 are cross-sectional views of partially fabricated structures that can be used to describe the fabrication stages of operation 320. As shown in FIG. 17, the formation of gate structures 210 can include coplanarizing top surfaces of ILD structure 230, gate spacers 804, and polysilicon structure 748 with each other using a CMP process. During the CMP process, capping layer 752 and hard mask layer 750 can be removed. Following the CMP process, the formation of gate structures 210 can further include selectively removing of polysilicon structures 748 to form recess structures 1801 (shown in FIG. 18), followed by removing portions of protective oxide layer 746 under polysilicon structures 748. Polysilicon structures 748 can be removed using a dry etching process (e.g., reaction ion etching) or a wet etching process. In some embodiments, the gas etchants used in the dry etching process can include chlorine, fluorine, bromine, or a combination thereof. In some embodiments, an ammonium hydroxide ($NH_4OH$), sodium hydroxide (NaOH), and/or KOH wet etch can be used to remove polysilicon structures 748, or a dry etch followed by a wet etch process can be used to remove polysilicon structures 748. The portions of protective oxide layer 746 under polysilicon structures 748 can be exposed after the removal of polysilicon structures 748. The exposed portions of protective oxide layer 748 can be removed using a dry etching process (e.g., reaction ion etching), a wet etching process (e.g., using diluted HF), or a combination thereof. In some embodiments, the gas etchants used in the dry etching process can include chlorine, fluorine, bromine, or a combination thereof. Further, the removal of polysilicon structure 748 and protective oxide layers 746 can be followed by the selective removal of semiconductor layers 1018 (shown in FIG. 17) using a wet etch process to form cavities 1803 (shown in FIG. 18). Cavities 1803 can be separated from source-drain region 224 by inner spacers 208. In some embodiments, void structure 214 can be positioned between cavity 1803 and source-drain region 224. In some embodiments, dielectric layer 212 can be positioned between cavity 1803 and void structure 214. In some embodiments, cavity 1803 can be horizontally (e.g., in the x-direction) sandwiched by two inner spacers 208.

In subsequent processing, cavities 1803 can be filled with one or more layers of gate structures 210 to form a gate-all-around structure around each of the channel layers 212 to form device 200 shown in FIGS. 2A and 2B. The forming of cavities 1803 can be followed by the deposition of (i) a layer of dielectric material for dielectric layers 112 on the structure of FIG. 18, and (ii) a layer of gate electrode 114 over dielectric layer 112. In some embodiments, as shown in FIG. 2A, dielectric layer 112 and gate electrode 114 can each form conformal layers within cavities 1803 (shown in FIG. 18). In some embodiments, as shown in FIG. 2B, dielectric layer 112 and gate electrode 114 can each wrap around channel layers 212 and fill cavities 1803 (shown in FIG. 18).

The layer of dielectric material for dielectric layer 112 can include silicon oxide and can be formed by CVD, ALD, PVD, e-beam evaporation, or other suitable processes. In some embodiments, the layer of dielectric material can include (i) a layer of silicon oxide, silicon nitride, and/or silicon oxynitride, (ii) a high-k dielectric material such as, for example, hafnium oxide ($HfO_2$), $TiO_2$, HfZrO, $Ta_2O_3$, $HfSiO_4$, $ZrO_2$, $ZrSiO_2$, (iii) a high-k dielectric material having oxides of Li, Be, Mg, Ca, Sr, Sc, Y, Zr, Al, La, Ce, Pr, Nd, Sm, Eu, Gd, Tb, Dy, Ho, Er, Tm, Yb, or Lu, or (iv) a combination thereof. High-k dielectric layers can be formed by ALD and/or other suitable methods.

In some embodiments, gate electrode 114 can include a layer of conductive barrier material, such as Ti, Ta, TiN, TaN, or other suitable diffusion barrier materials and can be formed by ALD, PVD, CVD, or other suitable metal deposition processes. In some embodiments, the layer of conductive barrier material can include substantially fluorine-free metal or metal-containing film and can be formed by ALD or CVD using one or more non-fluorine based precursors. The substantially fluorine-free metal or fluorine-free metal-containing film can include an amount of fluorine contaminants less than 5 atomic percent in the form of ions, atoms, and/or molecules.

In some embodiments, gate electrode 114 can include a layer of work function metal, such as Al, Cu, W, Ti, Ta, TiN, TaN, NiSi, CoSi, Ag, TaC, TaSiN, TaCN, TiAl, TiAlN, WN, metal alloys, and/or combinations thereof. In some embodiments, the layer of work function metal can include Al-doped metal, such as Al-doped Ti, Al-doped TiN, Al-doped Ta, or Al-doped TaN. The layer of work function metal can be deposited using a suitable process such as ALD, CVD, PVD, plating, or combinations thereof. The layer of conductive material for gate electrodes 132 can include Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof and can be formed by ALD, PVD, CVD, or other suitable deposition processes. The deposited layers of dielectric material, conductive barrier material, work function metal, and conductive material can be planarized by a CMP process to form the structure of FIGS. 2A and 2B. The CMP process can substantially coplanarize top surfaces of dielectric layer 112 and gate electrode 114 with top surfaces of ILD structures 230 as shown in FIG. 2A.

The formation of gate structures 210 can be followed by formation of other elements such as S/D contacts, gate contacts, vias, interconnect metal layers, dielectric layers, passivation layers, etc., which are not shown for the sake of clarity.

The embodiments described herein are directed to an inner spacer structure for GAA nano-sheet FETs (e.g., or GAA nano-wire FETs) and a method for forming the same. The inner spacer structure can separate the GAA nano-sheet FET's source-drain region from the GAA nano-sheet FET's metal gate structure that surrounds each nano-sheet layers of the GAA nano-sheet FET. In some embodiments, the inner spacer structure can include a void structure to reduce an overall dielectric constant of the inner spacer structure. In some embodiments, the inner spacer structure can be formed by forming a sacrificial layer between the GAA nano-sheet FET's source-drain region and the GAA nano-sheet FET's metal gate structure, annealing a portion of the sacrificial layer to form an oxide layer adjacent to the GAA nano-sheet FET's source-drain region, and removing an other portion of the sacrificial layer adjacent to GAA nano-sheet FET's metal gate structure. The inner spacer structure can provide a reliable confinement when growing source-drain epitaxial layers in the epitaxial region. Further, the process of forming the inner spacer structure is less subject to the issue of incomplete gap fill. A benefit of the inner spacer structure is to provide an air spacer structure to reduce electrical coupling between nano-sheet FET's gate and source/drain, thus improving device performance (e.g., speed) of the nano-sheet FET.

In some embodiments, a method for forming a semiconductor device can include forming a vertical structure over a substrate, forming a gate structure over a portion of the vertical structure, exposing sidewalls of the portion of the vertical structure, forming multiple spacers over the sidewalls of the portion of the vertical structure, and forming a void in each of the multiple spacers.

In some embodiments, a method for forming a semiconductor device can include forming a vertical structure with alternating first and second nano-sheet layers in a portion of the vertical structure and over a substrate, forming a gate structure over the portion of the vertical substrate, forming a recess structure in each of the second nano-sheet layers in the portion of the vertical structure, forming a spacer material stack in the recess structure, and forming a void in the spacer material stack.

In some embodiments, a semiconductor structure can include a substrate, and a vertical structure over the substrate. The vertical structure can include a first portion with one or more channel layers separated from each other, and a second portion with a source/drain region in contact with the one or more channel layers. The semiconductor structure can further include a gate structure between each of the one or more channel layers, and multiple inner spacers disposed between the gate structure and the source/drain region. Each of the multiple inner spacers can include a void.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a vertical structure over the substrate, wherein the vertical structure comprises:
      a first portion having one or more channel layers separated from each other; and
      a second portion having a source/drain region in contact with the one or more channel layers;
   a gate structure between each of the one or more channel layers; and
   a plurality of inner spacers disposed between the gate structure and the source/drain region, wherein each of the plurality of inner spacer comprises a void isolated from the source/drain region and a curved surface adjacent to the void and in contact with the source/drain region.

2. The semiconductor structure of claim 1, wherein each of the plurality of inner spacers is disposed between adjacent channel layers of the one or more channel layers.

3. The semiconductor structure of claim 1, wherein each of the plurality of inner spacers further comprises:
   an oxide layer; and
   a dielectric layer, wherein the oxide layer and the dielectric layer surround the void.

4. The semiconductor structure of claim 1, wherein the void is between adjacent channel layers of the one or more channel layers.

5. The semiconductor structure of claim 1, wherein:
   the first portion of the vertical structure comprises a base region under the one or more channel regions; and
   the gate structure is between the base region and the one or more channel regions, wherein one or more of the plurality of inner spacers are between the base region and the one or more channel regions.

6. A semiconductor device, comprising:
   a substrate;
   a vertical structure formed on the substrate;
   a stack of channel regions in the vertical structure, wherein the vertical structure comprises source/drain regions electrically coupled to the stack of channel regions;
   a gate structure surrounding each of the channel regions in the stack of channel regions; and
   inner spacers on opposite sidewalls of each gate structure, each inner spacer comprising first and second dielectric layers and a void between the first and second dielectric layers, wherein an interface between the first and second dielectric layers is perpendicular to a top surface of the substrate, and wherein the interface is substantially coplanar with a side surface of the void.

7. The semiconductor device of claim 6, wherein the void is filled with air.

8. The semiconductor device of claim 6, wherein the void has a rectangular shape.

9. The semiconductor device of claim 6, wherein the void has length, width, and height dimensions in a range of about 1 nm to about 8 nm.

10. The semiconductor device of claim 6, wherein the first dielectric layer comprises a low-k material having a dielectric constant less than about 3.5.

11. The semiconductor device of claim 6, wherein the inner spacers are located between the gate structures and the source/drain regions.

12. The semiconductor device of claim 6, wherein the sidewall of the void is parallel to another sidewall of the void.

13. A transistor, comprising:
   a substrate;

a stack of nanostructures formed on the substrate, the nanostructures comprising channel regions alternating with gate structures;

source/drain regions formed on the substrate, the source/drain regions coupled to the channel regions; and spacers formed adjacent to the gate structures, each of the spacers comprising first and second insulators and encapsulating a void structure, wherein a top of first insulator is aligned with a top of the second insulator along a direction parallel to a top surface of the substrate.

14. The transistor of claim 13, wherein the first and second insulators comprise at least two different dielectric materials.

15. The transistor of claim 14, wherein the void structures are formed between the at least two different dielectric materials.

16. The transistor of claim 14, wherein the at least two different dielectric materials include one or more of an oxide material, a nitride material, and a low-k dielectric material.

17. The transistor of claim 13, wherein the void structures have rectangular cross sections.

18. The transistor of claim 13, wherein each of the void structures is surrounded on three sides by the first insulator and on one side by the second insulator.

19. The transistor of claim 13, wherein the void structures have a dielectric constant substantially equal to 1.0.

20. The transistor of claim 13, wherein an interface between the first insulator and the source/drain regions is curved.

* * * * *